United States Patent
Furlano et al.

(10) Patent No.: US 9,057,742 B2
(45) Date of Patent: Jun. 16, 2015

(54) FUNCTIONAL MEASURING GROUP FOR A MEDIUM-VOLTAGE DISTRIBUTION SUBSTATION

(71) Applicant: Schneider Electric Industries SAS, Rueil Malmaison (FR)

(72) Inventors: Stephane Furlano, Izeron (FR); Sebastien Brunet, Grenoble (FR); Frederic Toti-Buttin, Pont de Claix (FR); Venanzio Ferraro, Grenoble (FR); Somesha Somegowda, Karnataka (IN)

(73) Assignee: SCHNEIDER ELECTRIC INDUSTRIES SAS, Rueil Malmaison (FR)

( * ) Notice: Subject to any disclaimer, the term of this patent is extended or adjusted under 35 U.S.C. 154(b) by 282 days.

(21) Appl. No.: 13/779,191

(22) Filed: Feb. 27, 2013

(65) Prior Publication Data
US 2013/0221948 A1  Aug. 29, 2013

(30) Foreign Application Priority Data

Feb. 28, 2012  (FR) ...................................... 12 00573

(51) Int. Cl.
*G01R 19/00* (2006.01)
*H02B 13/01* (2006.01)
(Continued)

(52) U.S. Cl.
CPC ................ *G01R 19/00* (2013.01); *H02B 13/01* (2013.01); *H02B 13/025* (2013.01)

(58) Field of Classification Search
CPC ...... G01R 15/00; G01R 19/00; G01R 21/132; G01R 31/00; G01R 27/08; G01R 27/26; G01R 27/00; G01R 11/63; G01D 4/004; G05B 1/00; G08B 2/00; G06F 19/00; G06F 17/40

USPC ........ 361/600, 602, 605, 611–624, 632–648; 324/156, 103 R, 658, 74, 713, 76.1, 324/537; 702/57, 60–67
See application file for complete search history.

(56) References Cited

U.S. PATENT DOCUMENTS 5,210,679 A * 5/1993 Takamoto et al. ............ 361/618
6,671,654 B1 * 12/2003 Forth et al. .................... 702/182
(Continued)

FOREIGN PATENT DOCUMENTS

DE 34 30 776 A1 8/1985
EP 2 063 495 A1 5/2009
(Continued)

OTHER PUBLICATIONS

French Preliminary Search Report issued Sep. 24, 2012, in French 1200573, filed Feb. 28, 2012 (with English Translation of Categories of Cited Documents).

*Primary Examiner* — Michail V Datskovskiy
(74) *Attorney, Agent, or Firm* — Oblon, McClelland, Maier & Neustadt, L.L.P.

(57) ABSTRACT

The design of a functional measuring group for a medium-voltage substation has been optimized to make the product compact and robust in terms of internal arc, and also to favour complete accessibility to the measurement sensors. In particular, the voltage sensors are located in a vertical plane directly accessible via the front panel of the group, and the current sensors are located in the rear housing of the group, being directly accessible via the top of the group. In addition to being placed in an insulated compartment, the voltage sensors are insulated and shielded, and their connection terminals are designed for connection by cable with a flat interface.

19 Claims, 11 Drawing Sheets

(51) Int. Cl.
*H02B 13/025* (2006.01)
*G06F 17/40* (2006.01)

(56) References Cited

U.S. PATENT DOCUMENTS

| | | | |
|---|---|---|---|
| 6,832,169 B2* | 12/2004 | Wakida et al. | 702/62 |
| 7,337,081 B1* | 2/2008 | Kagan | 702/60 |
| 8,126,667 B2* | 2/2012 | Zhang et al. | 702/65 |
| 8,248,760 B2* | 8/2012 | Abrahamsen et al. | 361/611 |
| 8,284,002 B2* | 10/2012 | Heller et al. | 335/202 |
| 8,547,201 B2* | 10/2013 | Katayama et al. | 340/5.6 |
| 8,930,153 B2* | 1/2015 | Kagan et al. | 702/64 |
| 2005/0174721 A1 | 8/2005 | Chevallier et al. | |
| 2009/0130904 A1 | 5/2009 | Bonfils | |
| 2009/0299664 A1* | 12/2009 | Zhang et al. | 702/65 |
| 2011/0232959 A1 | 9/2011 | Romanet-Perroux et al. | |
| 2012/0001645 A1* | 1/2012 | Javora et al. | 324/658 |

FOREIGN PATENT DOCUMENTS

| | | |
|---|---|---|
| EP | 2 253 963 A1 | 11/2010 |
| FR | 2 839 817 A1 | 11/2003 |
| FR | 2 940 546 A1 | 6/2010 |
| FR | 2 950 202 A1 | 3/2011 |
| WO | WO 2009/010493 A1 | 1/2009 |

* cited by examiner

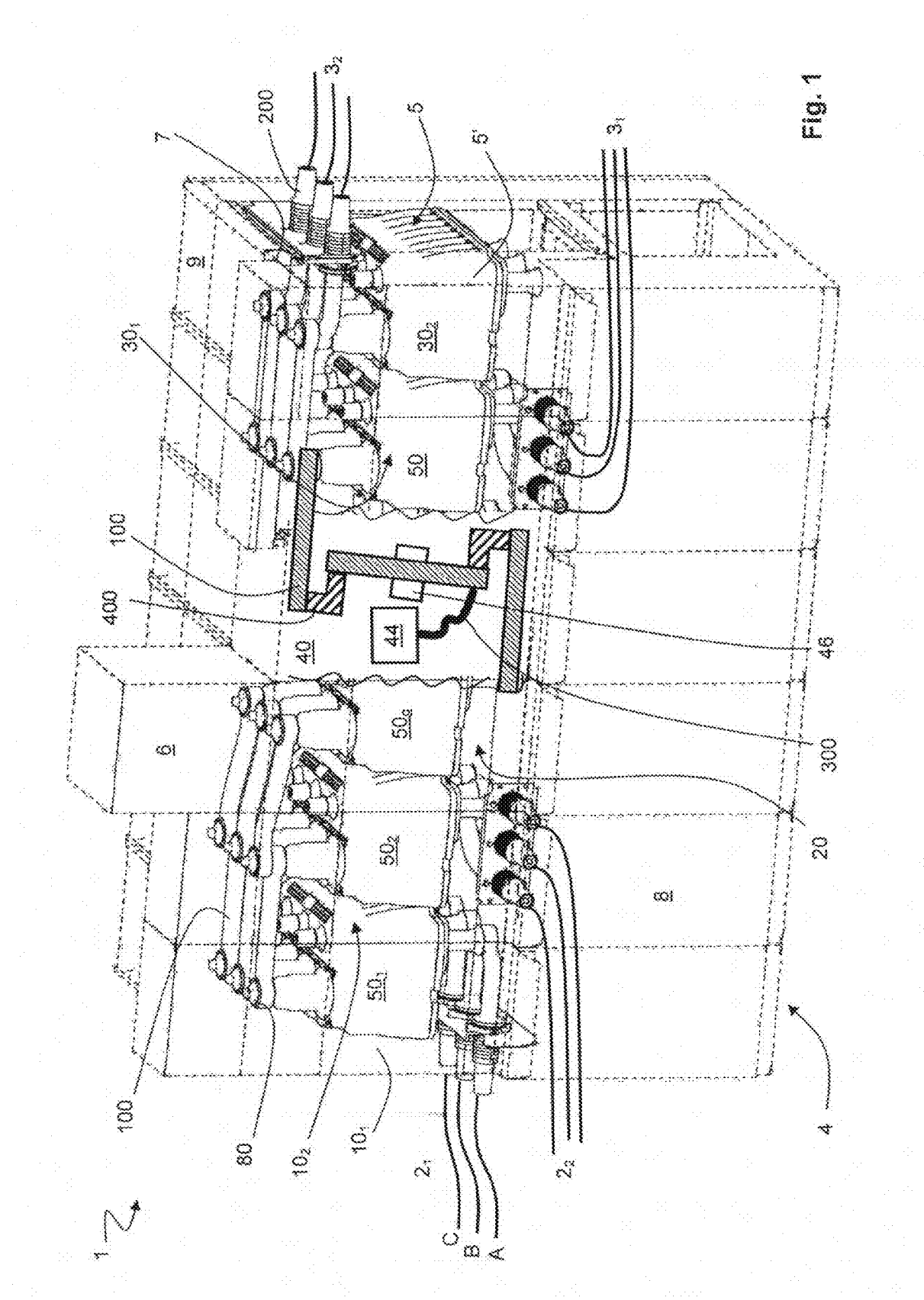

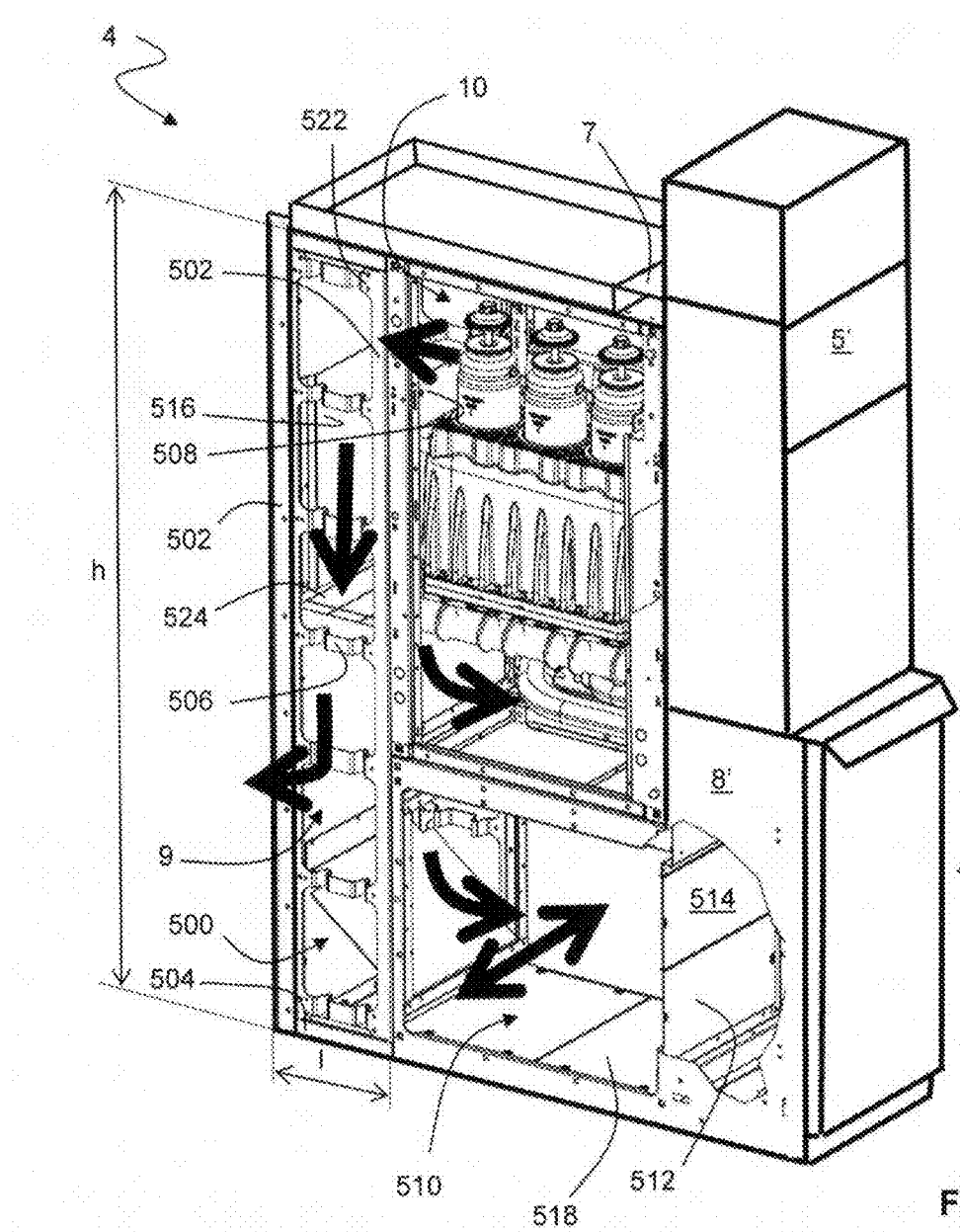
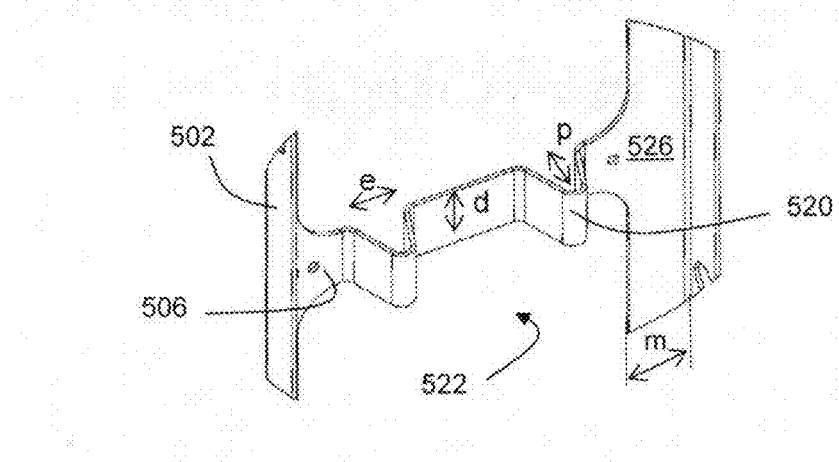
Fig. 10A
Fig. 10B

FUNCTIONAL MEASURING GROUP FOR A MEDIUM-VOLTAGE DISTRIBUTION SUBSTATION

BACKGROUND OF THE INVENTION

The invention relates to optimization of a measuring group for a medium-voltage distribution substation, in which the arrangement of the different elements is associated with a simplification of connection between electric switchgear units of the substation for an enhanced compactness and visibility.

STATE THE ART

In electric equipment, in particular in medium-voltage MV distribution substations (also sometimes referred to as high-voltage HVA), i.e. about 1 to 52 kV or 75 kV, different switchgear units for current interruption and/or measurement have to be electrically connected to one another. Furthermore, on account of the high voltages and to protect them, it is advantageous to insulate the connections by over-moulding, and even to metalclad them in order to increase the compactness of the assembly and to direct the electric field.

Different solutions have been developed, with in particular fitting of rigid bars connected to the switchgear units. Plug-in connectors of external or internal cone type according to the standard EN 50181 are then inserted. An alternative solution enabling the overall dimensions to be reduced, in particular the height, is presented in the document EP 2,063,495. This solution using compressible flat interfaces further facilitates connection operations.

The use of this type of connection, due to its simplicity and compactness, further enables a functional measuring group with optimized arrangement to be designed. MV substations do in fact usually comprise functional units enabling measurement, in particular of the voltage, but these units are very voluminous on account of the arrangement of the sensors.

SUMMARY OF THE INVENTION

Among other advantages, the object of the invention is to propose a functional measuring group for a medium-voltage distribution substation the arrangement of which is optimized to increase its compactness and facilitate installation and maintenance.

The invention relates in particular to a functional group comprising a substantially rectangular-shaped enclosure formed by two housings separated by a wall. A front housing of the group comprises voltage measuring means, located on a vertical plane and preferably directly accessible via a door of the group parallel to said plane. Advantageously, the voltage measuring means comprise three shielded voltage sensors, the terminals of which are aligned in a vertical direction and are formed by an axial conductor coated in an insulating support from which it opens out in the centre of a connection disk by a connecting surface.

The second housing of the measuring group houses the connection means to another functional group of a distribution substation, said connection means for input forming a first horizontal plane parallel to a second plane formed by the connection means for input. Advantageously, the connection means of the group each comprise a conducting insert integrated in a support made from insulating material and opening out in the centre of a connection disk by a connecting surface.

The voltage measuring means are connected to the connection means by a flexible cable provided at both ends with connection devices adapted to the terminal of the measuring means and to the connection means involved. Advantageously, the cable connection devices are identical and comprise a support made from deformable insulating material delineated by two opposite connection surfaces that are substantially parallel and superposable on the connection disks, and with a conducting connecting insert embedded in the insulating support and opening out from the connection surfaces via opposite connecting surface. The height of the insert is smaller than the thickness of the support so that a compression between the two connection surfaces enables equalization of the distances and electric connection.

The measuring group can also comprise current measuring means located in the second housing of the connection means and directly accessible via a second surface of the enclosure of the group, in particular the top. Preferably, the current measuring means comprise three toroids coiled around connecting bars between the input and output means of the group. The connecting bars preferably comprise connection devices similar to those of the cables, at each end, and the connection means are associated with auxiliary elements enabling the orientation of the connection surfaces to be modified, in particular elbows provided with two connection disks.

The invention also relates to a functional unit in which the measuring group is associated with a cable passage compartment, and a distribution substation comprising a juxtaposition of functional units connected to one another by connecting bars similar to those of the preferred measuring group.

More generally, the invention relates to a functional measuring group for a medium-voltage distribution substation comprising a substantially rectangular-shaped enclosure, three current input connection means, three current output connection means, and voltage measuring means. The input, respectively output, connection means are aligned in two parallel planes of the enclosure. The enclosure comprises a first housing for the voltage measuring means, said compartment being directly accessible via an access panel of the enclosure orthogonal to said planes. The voltage measuring means comprise connection terminals located in a plane parallel to the access panel. The connection terminals of the measuring means are connected to the connection means of the group by means of flexible cables. The terminals of the voltage measuring means and/or the connection means of the group comprise an axial conductor embedded in an insulating support which is partially coated by a shielding so that the connection surface of the terminal is a disk in which a connecting surface of the conductor is centred. The input and output connection means of the group are connected to one another by connecting bars provided at each end with a connection device comprising: a support of the insulating material delineated by two substantially parallel opposite connection surfaces; a conducting connecting insert integrated in the insulating support and opening out onto the two connection surfaces at the level of two parallel flat connection surfaces, the height of the insert between its two connecting surfaces being smaller than the distance between the two connecting surfaces when the insulating material of the support is at rest, and greater than or equal to said distance when the material is entirely deformed by compression between its connection surfaces.

BRIEF DESCRIPTION OF THE DRAWINGS

Other advantages and features will become more clearly apparent from the following description of particular embodiments of the invention, given for illustrative and in no way restrictive example purposes only, represented in the appended figures.

FIG. 1 shows a medium-voltage distribution substation according to a preferred embodiment of the invention.

FIG. 10A shows the enclosure of a functional unit of a distribution substation according to a preferred embodiment of the invention, with a diagram of the gas flow; FIG. 10B represents an enlargement of an element of the enclosure.

DETAILED DESCRIPTION OF A PREFERRED EMBODIMENT

Figure 2A:
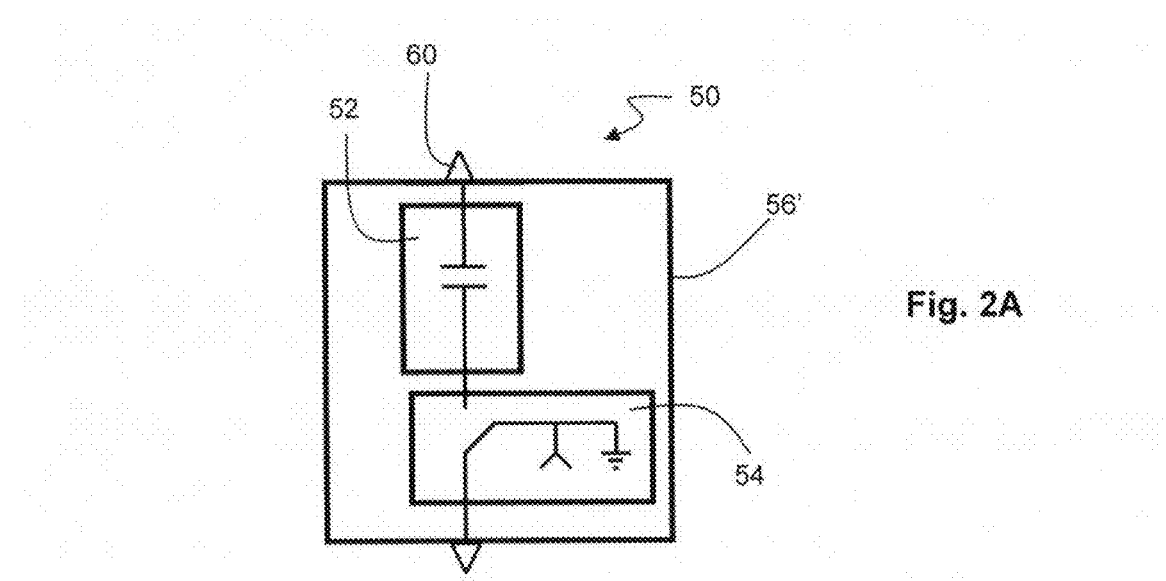
FIGS. 2A and 2B represent a current interruption and disconnection cubicle in two configurations for a substation according to an embodiment of the invention.

As illustrated in FIG. 1, a medium-voltage (MV) electric distribution substation 1 is installed between the input 2 of the electric power system and at least one user feeder 3 which supplies different loads. The current interruption and/or earthing functions are in particular performed for each power supply phase A, B, C at the level of the substation 1. Other functions can be added, in particular measurements of different parameters.

The distribution substations 1 thus comprise several types of units which are associated with one another. Modular systems are known in which each functional unit comprises the means for performing at least one functionality and can be associated with another functional unit, of the same type or not, to form an assembly meeting the user's requirements as best as possible: see for example the SM6 offer from Schneider Electric.

A functional unit 4 of a MV substation 1 comprises an enclosure, which is usually made from metal, containing at least one electric apparatus and provided with means enabling access to coupling elements between units 4, and also to the outside 2, 3. Advantageously, all the units are of identical width, for example 375 mm, or a multiple of this pitch. Conventionally, the enclosure is formed by several compartments, including in particular a MV functional group 5 which is surrounded by other elements performing different functions. In particular, a case 6 located above is reserved for the low-voltage protection, instrumentation and control apparatuses. Its depth conventionally corresponds to the thickness of the control compartment 5' of the functional group 5, and its other dimensions, in particular its height, can vary according to the devices it houses. Preferably, the LV case 6 is manufactured as described in in the document FR 2,950,202, and it can be associated with a trunking 7 enabling the cables that are necessary for it to be "stowed away", this trunking 7 also being able to be extended vertically in the control compartment 5' of the functional group 5. Below the functional group 5, a bottom compartment 8 dedicated to management of the cables and MV inputs/feeders is conventionally to be found, advantageously arranged as in patent application FR 11 03799. As specified further on, the bottom compartment 8 is, in the preferred embodiment, arranged for flow of the gases, and is preferably associated with a rear compartment 9 of the functional unit 5 to optimize said gas flow.

The MV group 5 can perform different functions, and in particular correspond to a switchgear group 10, 20, 30 or a measuring group 40. In the scope of current interruption, the functional module 5 comprises a control compartment 5' on its front panel and the electric switchgear apparatus 50 for interrupting the three phases A, B, C is housed in an enclosure 12 usually made from metal plate and of rectangular shape.

In the preferred embodiment of the invention, the switchgear apparatuses 50A, 50B, 50C are identical for each phase and in compliance with cubicles as described in the document FR 2,940,516. In particular, as illustrated in FIG. 2A, a switchgear cubicle 50 comprises in series a vacuum cartridge 52 performing the interruption and disconnection function and a two-position selector 54 which can take a service position allowing flow of the current and an earthing position (alternatively, the selector 54 could take an optional third opening position). Series connection of the earthing selector 54 enables disconnection to be performed by a cubicle of small dimensions and without the use of sulphur hexafluoride which contributes to the greenhouse effect, including in the event of subsequent malfunctioning of the vacuum cartridge 52.

Figure 2B:
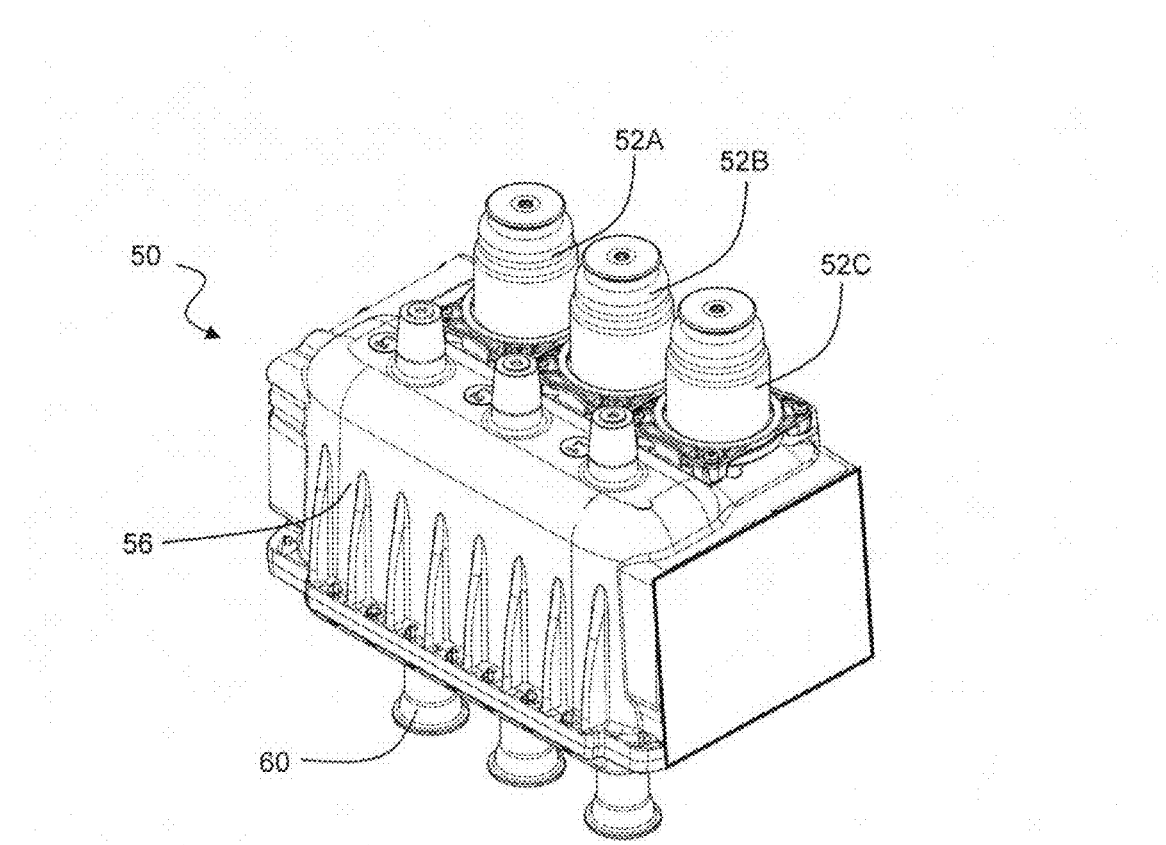

In an advantageous embodiment, the selector 54 is housed in a confinement enclosure 56. Different options are possible: as illustrated schematically in FIG. 2A, the enclosure 56' houses all the elements 52, 54 of a switchgear cubicle 50. It is possible for the three cubicles 50A, 50B, 50C of the same group 5 to be unitary in one and the same enclosure. In the preferred embodiment illustrated in FIG. 2B, the three selectors 54 of a functional group 10, 20, 30 are housed in the same unitary enclosure 56. The vacuum cartridges 52A, 52B, 52C which are connected to it remain external to said enclosure 56, while being secured thereto in tightly sealed manner so as to form an assembly 50 no element of which is in the air except for the connection terminals 60. Other alternatives are possible.

As stipulated in the foregoing, the distribution substation 1 comprises a plurality of functional units 4, several of these 10, 20, 30 being able to comprise switchgear cubicles 50. In particular, in the illustrated embodiment, it can be observed that two current inputs $2_1$, $2_2$ are connected to the substation 1, a typical configuration of an open-loop or double-branch power system. Each of the inputs $2_1$, $2_2$ is associated with a cubicle $50_1$, $50_2$ performing the function of a switch in order to isolate the circuit from the rated current. The three poles 50A, 50B, 50C connected to the three conductors of each input 2 are housed in the same enclosure 12 of a switchgear group 10.

The two input lines are then connected at the level of the busbar to be connected to a general circuit breaker, fitted in the adjacent unit in order to perform protection of the panel by interrupting short-circuit currents. Preferably, the switchgear apparatus $50_g$ of the general circuit breaker group 20 is similar in principle to the switching apparatuses $50_1$, $50_2$ of the input modules 10.

After the general circuit breaker module 20, the common line continues to run to other functional units 4, according to requirements, to in particular be terminated by several feeders $3_1$, $3_2$ enabling user-defined loads to be supplied, each feeder 3 being associated with a transformer protection circuit breaker group 30 serving the purpose of breaking possible faults originating from the MV/LV transformers down-line from the substation 1.

Here again, the switchgear apparatus 50 of group 30 can be of similar principle to the previous ones. The preferred embodiment of the switchgear cubicles 50 in fact enables the different functions to be performed with identical switchgear apparatuses, with modification of a few parameters, and in particular only of the material used for manufacturing the contact pads of the vacuum cartridge 52.

Although such a modularity reduces the number of industrial references and facilitates installation of the substation 1, it remains tributary to the connections between the units 4, and it soon becomes apparent that management of the latter can prove complex and also require a certain amount of space. For reasons of compactness, but above all to simplify the connections between the electric apparatuses, according to the invention, the connections are performed by means of bars 100 with a flat interface, the principle and an embodiment of which are described in particular in the document EP 2,063, 495.

Figure 3A:
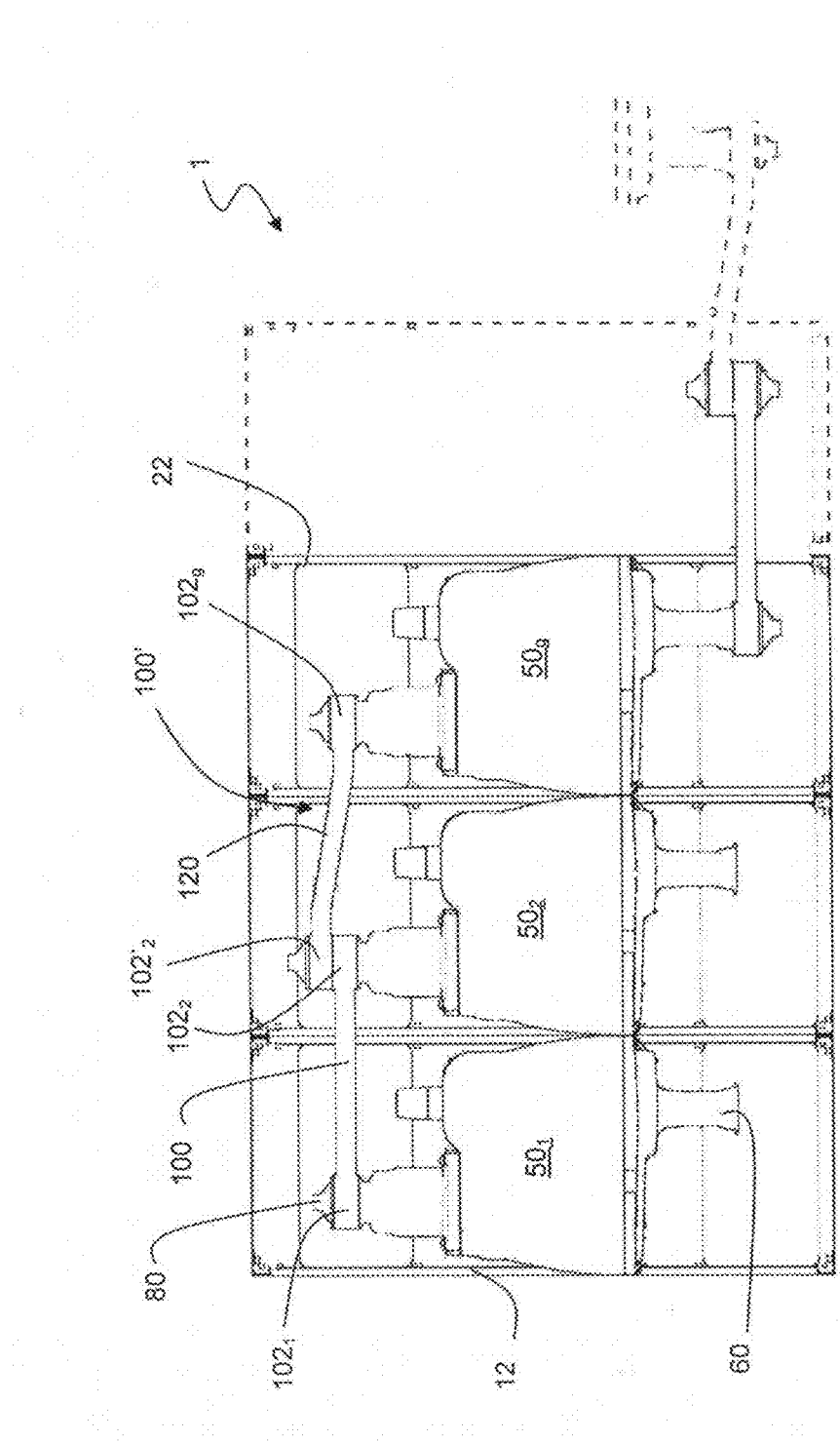
FIGS. 3A and 3B show connection in a distribution substation according to an embodiment of the invention, with in particular an example of a connecting bar.
Figure 3B:
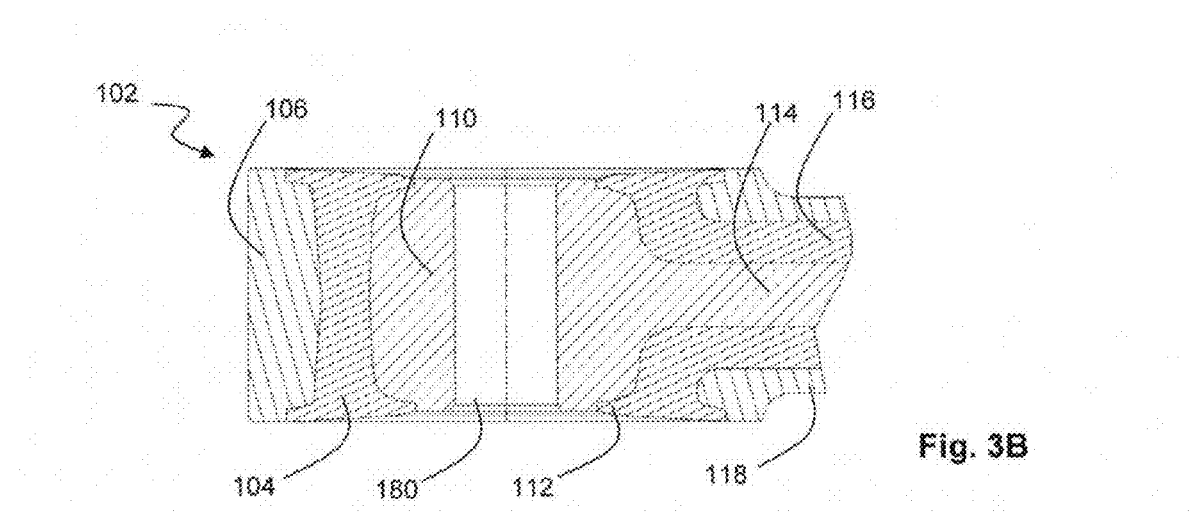

In particular, as illustrated in FIGS. 3, a bar 100 connects two cubicles $50_1$, $50_2$, $50_g$ of units $10_1$, $10_2$, 20 by means of connection devices 102 located at each of its ends and mainly formed by a support 104 made from insulating material, with two opposite surfaces designed for connection, which are substantially flat, parallel to one another, circular (the most suitable shape for managing the different dielectric phenomena and for optimizing the orientation of the stacks) and superposable so that the bar 100 can be used without a preferred orientation. In general manner, the bar 100 is symmetric and the connection devices 102 are identical, their connection surfaces being parallel to one another.

The insulating support 104, with the exception of the connection surfaces, is coated with a conducting or semiconducting layer 106 having a thickness that is determined according to its resistivity so as to obtain a sufficient coating 106 to perform electrostatic shielding of the assembly. Maintaining the electric field inside the insulating support 104 enables the compactness of the connections made by a bar 100 provided with such a device 102 to be increased.

The connection device 102 comprises a connecting insert 110 with a high electric conductivity, usually made from copper or aluminium, which passes through the thickness of the connection device 102, between two flat and parallel connecting surfaces which are accessible on each side of the insulating support 104. The connecting insert 110 is centred within the insulating support 104, and is symmetric of revolution in order to master dielectric constraints to the maximum. To optimize the dielectric strength, the connecting insert 110 is integrated in the insulating support 104, and in particular the insulating material is over-moulded on the insert 110 so that the interface between the two compounds 104, 110 is mastered and devoid of empty spaces (or spaces filled with air). For the same reasons, the connecting insert 110 comprises a swelling within the insulating support 104, its central diameter thus being larger than the diameter of the connecting surfaces at the level of which the insulating material forms a neck, or throat, 112 around the insert in order to reduce the electric field at the level of the triple point of the interface on the side where insert is located. The conducting insert 110 is in some way embedded in the insulating material 104.

The connection devices 102 of one and the same bar 100 are linked to one another by a rod 114 having a high unitary electric conductivity with the connecting insert 110, and dimensioned according to the current flowing therein. The rod 114 is not compressible, but to ensure a certain flexibility corresponding to a tolerance in the relative positioning of the connection devices 102 in the connection direction (orthogonal to the connection surfaces), the cross-section of the rod 114 is "flattened", of oblong shape.

The conducting link rod 114 is also integrated at its ends in the insulator 104 of the connection device 102. Over the rest of its length, the residual part corresponding to the apparent length of the rod 114 is coated with an insulator 116 which provides a sufficient dielectric strength. To reduce the necessary space around the bar 100, an electrostatic shielding 118 of the residual part is fitted. The set of insulating components 104, 116 of the connecting bar 100 are in fact produced in one step on all of the conducting elements 110, 114. In the same way, the shielding 106, 118 is unitary.

As illustrated in FIG. 3A, it is advantageous to have two geometries available for the bars 100, 100', with in particular a bar 100 the connection devices $102_1$, $102_2$ of which are coplanar, and a bar 100' in which the two devices $102'_2$, $102'_g$ are offset from one another in the direction orthogonal to their surface, by the height of an insert 110. This makes it possible to compensate for the differences of level due to series connection of two bars 100, 100' to successively connect three cubicles $50_1$, $50_2$, $50_g$. Advantageously, the offset is achieved by shaping of a bearing 120 on a bar 100', the bearing 120 preferably being fitted on half of the length of the rod 114 and centred.

To prevent flashovers when electric connection is performed and to ensure a tight contact between the superposed connection devices 102, 102' of the two bars 100, 100', the insulating material of the supports 104 is deformable, and in particular its thickness can be reduced by orthogonal crushing between the two opposite faces. In particular, the support 104 is obtained by moulding of an elastomer the dielectric qualities of which are known and optimized, in particular an EPDM rubber (EPDM standing for Ethylene-Propylene Diene Monomer), or by silicone. Thus, as far as the preferred production of a bar 100 is concerned, the conducting core (inserts+rod) 110, 114 is first made, in particular from aluminium for 630 A or from copper for 1250 A, by existing techniques, for example by die-stamping or by moulding. This assembly is over-moulded with an insulator 104, 116 of EPDM elastomer type, advantageously with the presence of an adhesion agent to ensure a cohesive and fault-free interface between the conducting core and insulating coating. The shielding 106, 118 can be achieved, for example on a deburred external surface, by over-moulding with an elastomer of the same type but charged with conducting particles, which enables the same deformation properties to be preserved on the whole of the connection device 102, between the insulating body 104 and shielding 106.

The height of the conducting insert 110, defined by the distance between its two connecting surfaces, is therefore smaller than the thickness of the insulating support 104 at rest. Orthogonal compression of the insulating support 104 can bring towards the connection surfaces of the support 104 so that their separating distance is equal to said height. In use, the insulating surfaces are brought into contact, and deformation is performed until the conducting connecting surfaces of the insert 110 are in contact with one another, and the assembly is kept in this position by clamping means so long as electric connection is required.

The size of the insulating support 104, and also the thickness of the throat 112, depends on the size of the conducting insert 110, itself determined by the level of the current which is flowing therein and on the electromechanical constraints. The dimensions of the rod 114 are also determined by the nature of the conducting material used and by the current flowing in the latter. In particular, for a substation 1 according to a preferred embodiment, the recommended dimensions for the connection devices 102 are: a diameter of 84 mm for a height of 42 mm of flexible material 104 being able to be compressed to a height of 38 mm of aluminium insert 110. There may been only a single bar of this kind for 17 and 24 kV substations, which enables management of stocks to be optimized by reducing the number of industrial references. According to a preferred embodiment, the length of the bars 100 between two connection devices $102_1$, $102_2$ (taken from insert to insert 110) corresponding to the width of a functional unit 4 is equivalent to the height of a switchgear cubicle 50, taken from terminal to terminal 60, i.e. equal to 375 mm, in order to enable a group 5 to be "replaced" by a bar 100 (see further on and FIGS. 1 and 7).

Figure 4A:
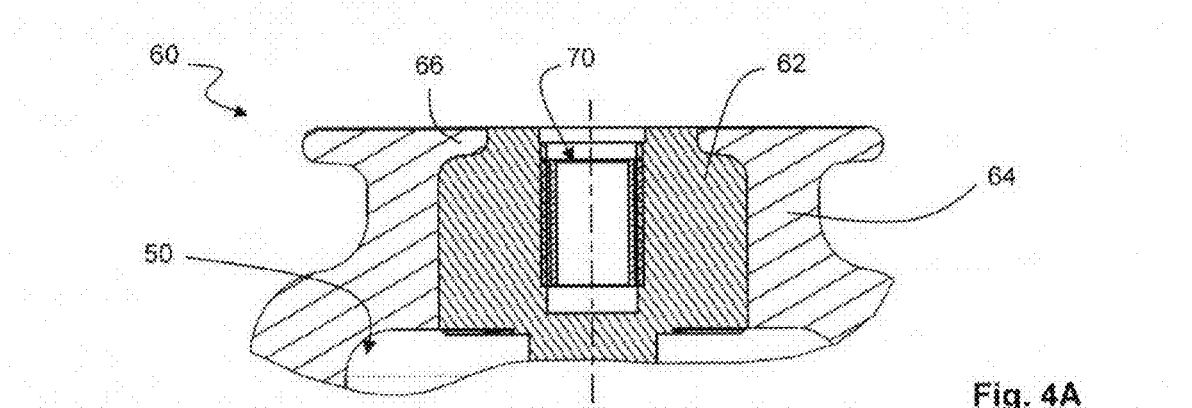
FIGS. 4A and 4B illustrate the modifications of other elements of the distribution substation to optimize preferred connection of a substation according to the invention.
Figure 4B:
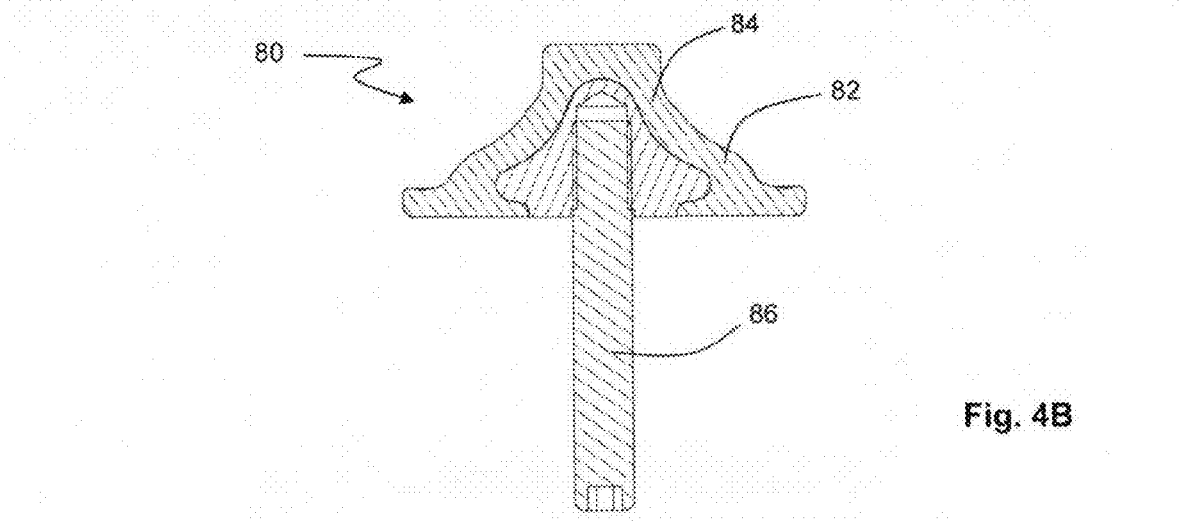

As the connection device 102 of a bar 100 is designed to be connected to a terminal 60 of an electric apparatus, and as simplicity of assembly implies two opposite surfaces of the connection devices 102 of the bars 100 that are identical, the terminals 60 of the switchgear cubicles 50 are designed accordingly, with in particular a "flattening" to achieve a flat interface. In particular, as illustrated in FIG. 4A, in similar manner to the connection device 102, the terminal 60 comprises a connecting insert 62 centred in an insulating support 64, the contact surfaces of the insert 62 and of the support 64 being superposable on the corresponding surfaces 110, 104 of the connection device 102 of a bar 100. The terminal 60, which is preferably shielded, is mainly composed of an insulating material over-moulded on the insert 62, and advantageously forms a throat 66 under the contact surface, which optimizes the dielectric characteristics. In a preferred embodiment, the terminal is shielded and is salient from the cubicle 50 over a height of about 30 mm. The insulating material 64 of the terminal is preferably non-deformable, the surface of the terminal 60 being a flat disk and being suitable for contact and compression with a connection device 102 of a bar 100.

To ensure that the connection devices are kept in the "compressed" position, clamping means are provided. Advantageously, the clamping device 80, in addition to performing compression of the assembly and keeping the latter in the clamped position, performs insulation of the surface of the connection device 102 which remains free (opposite the electric connection surface). In particular, a clamping device 80 comprises a flat surface with a size at least equal to the connection surface and forms an insulating cover the shape of which is optimized for dielectric strength. To ensure tightness and maximum protection against flashovers, the material 82 of the clamping and blanking device 80 is non-deformable, in particular for example a polymer material of thermosetting type, or even of thermoplastic type, preferably epoxy. A metallic coating 84 protects this material and ensures continuity of the shielding. The external shape of the device 80 can be adapted to include auxiliaries, for example sensors for a Voltage Detector Sensor (VDS) or a Voltage Presence Indicator Sensor (VPIS).

To enable easy fitting and clamping, the blanking and clamping device 80 comprises a link means 86 which can operate in conjunction with the connection devices 102. In particular a bolt or gudgeon-pin 86 is salient from the centre of the flat surface of the clamping device 80, and collaborates with a hole 180 drilled in the centre of the connecting inserts 110 of the connection device 102. The hole 180 can be tapped, but it is preferably of larger diameter than that of the gudgeon-pin 86 which is clamped on the other side of the connected assembly, in particular directly in the terminal 60 which comprises the suitable tapped hole 70.

Figure 6A:
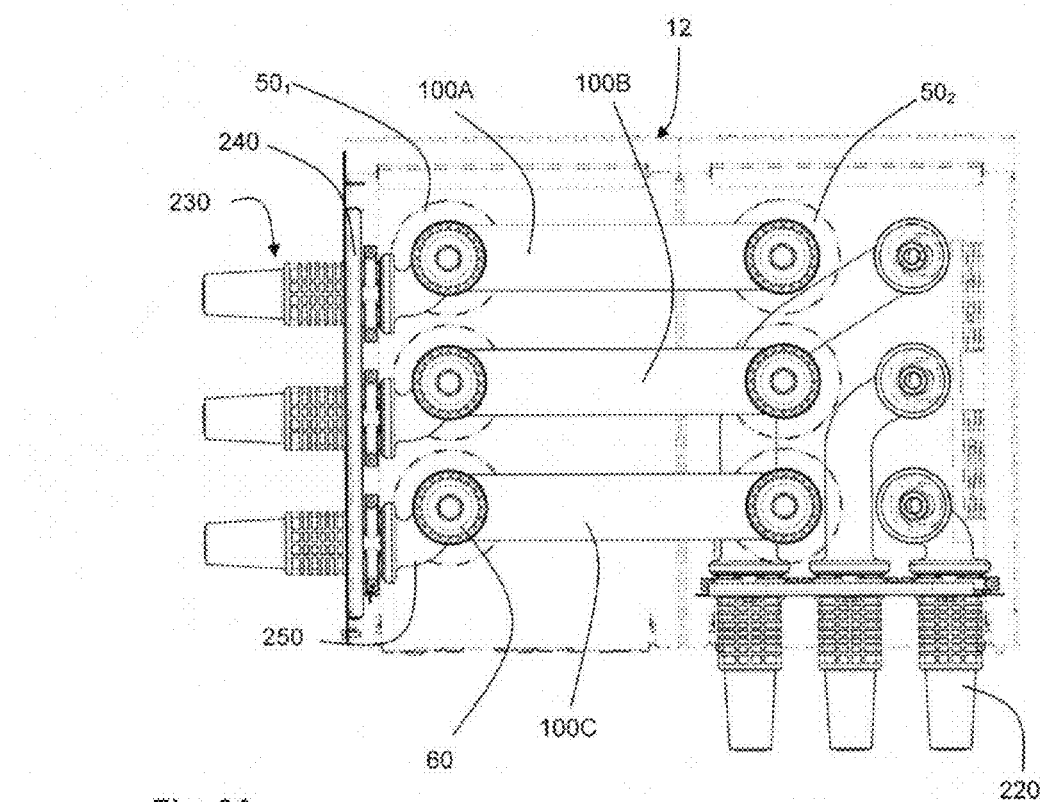
FIGS. 6A, 6B and 6C show arrangements of connectors for a distribution substation according to the invention.

As presented in the foregoing, the switchgear groups 10, 20, 30 of the distribution substation 1 each comprise three current breaking poles 52A, 52B, 52C, for each of the supply phases. For reasons of compactness, it is preferred for the cubicles 50 of a functional unit 4 to be aligned in the depthwise direction of the enclosure 12. In this way, the bars 100A, 100B, 100C connecting two switchgear cubicles of two adjacent modules to one another are parallel to one another and to the front panel of the substation 1, and are essentially straight, without any large bend or deviation (see also FIG. 6A). This configuration enables a better visibility in case of maintenance and for installation, and also results in the overall dimensions of the substation being kept small.

Connection of the input of the power system 2 and/or to the user feeder 3 is achieved in the usual manner by interfaces of external cone type, mainly of A, B or C type, or other, according to the EN 50181 standard, i.e. end-pieces salient outward from the enclosure 12 of the groups 10, 30, the latter usually remaining closed once the substation 1 has been installed. This type of end-piece notably has a partially standardized profile formed by a portion of cone, for example having a length of 90 mm and diameters of 46/56 mm for the C type, onto which the suitable separable connector with which the end of the cables 2, 3 is provided is plugged.

Figure 5A:
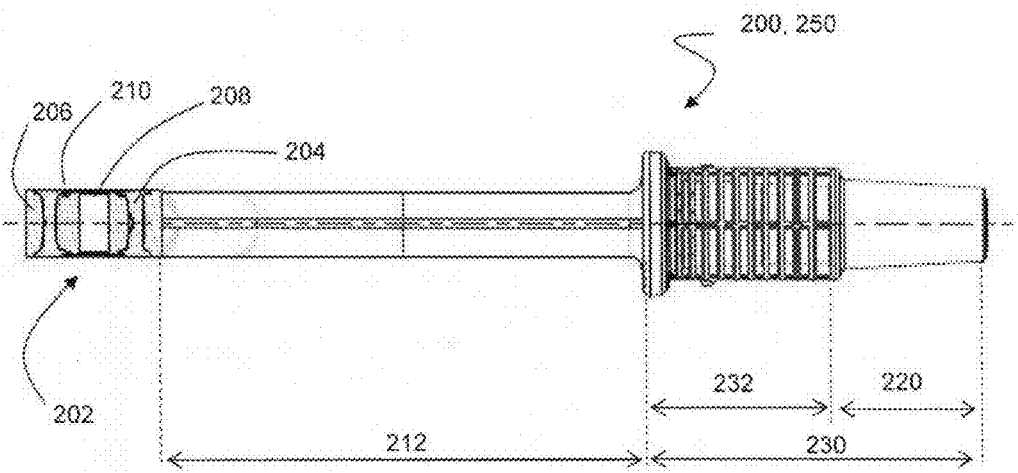
FIG. 5A represents a connector for a preferred distribution substation according to an embodiment of the invention, FIGS. 5B and 5C illustrating two embodiments thereof.

For optimal use in a substation according to the invention, the end-piece is located at one end of a connector 200 illustrated in FIGS. 5A, and acting as interface between the apparatuses 50 of the units 5 and the user's power system 2, 3. The second end of the connector 200, in the form of a horn in the represented embodiment, is thus provided with a connection device 202 which can be fitted on a terminal 60 of a switchgear cubicle 50 and/or a connection device 102 of a bar 100. The connection device 202 of a connector 200 is advantageously identical to the connection device 102 of a previously described bar 100, and in particular comprises a compressible insulating support 204 made from elastomer, covered by an electrostatic shielding 206, and through which a conducting insert 210 of smaller length than the thickness of the support 204 passes, the dimensions of the latter being similar to those previously given, through which a hole 208 enabling fitting of a blanking and clamping device 80 is preferably drilled.

In the same way, a link part 212 extends the connection device 202, with a rod 214 securely affixed to the insert 210 in the direction of the external connecting end-piece. Here again, the rod 214 and insert 210 are unitary, and the insulating support 204 over-moulded on the insert 210 is extended by the same insulator 216 around the rod 214, which is preferably of oblong cross-section to easily compensate any deviations in alignment. A shielding 218 is fitted.

At the other end of the rod 214 and of its coating 216, the horn 200 comprises a connecting end-piece 220. As presented in the foregoing, the end-piece 220 has a standardized external shape. At the present time, this type of end-piece is made from thermoplastic material so that draw-out can be easily performed. However, as the connector 200 according to a preferred embodiment of the invention comprises a flexible overmoulding 216 around the conducting rod 214, overmoulding of the conducting core by a thermosetting material would involve manufacturing the horn 200 in two distinct parts, generating additional interfaces, not to mention the complexity and cost of such manufacturing.

On the contrary, the use of an end-piece 220 manufactured on the model of the connection device 202, i.e. with a compressible external surface, is not desirable. It is in fact imperative for the connection on the end-piece 220 to be able to be broken in conventional manner, by draw-out, throughout the lifetime of the distribution substation 1, i.e. about 40 years in usual operation. However, connection of a plug-in cable on a flexible cone, in addition to the problems due to the high friction coefficient, gives rise to sticking phenomena linked to the presence of an elastomer/elastomer interface between the separable connector of the cable and the draw-in support of the cross-member. These sticking phenomena can result for high ratings in forces of more than 90 daN to extract the cable, forces considered by the standard as corresponding to non-withdrawabilty.

According to the preferred embodiment, the connector 200 is achieved by a monoblock part which comprises fitting of a rigid shell 222 for the draw-out end-piece 220, extension of the metal insert by a current conductor 224 within the shell 222 and opening out for connection, and preservation of an elastomer support 226 between the shell 222 and current conductor 224, said elastomer support 226 extending that 204 of the connection device 202 which enables connection of the horn 200 by simple pressure on a bar 100 and/or terminal 60 as described in the foregoing.

The shell 222 is preferably made from thermoplastic material, in particular polyamide 6 charged with glass fibres. The conducting assembly 210, 214, 224 of the horn 200 is manufactured in unitary manner, in the preferred embodiment from aluminium, with a standardized hole, which may be tapped, 228 at the end in the shell 222 according to the type of standardized end-piece made. The insulating elastomer 226 is arranged between the shell 222 and its conducting insert 224, in continuation of the support 204, 216 of the connection device 202 and of the link part 212, and unitary with the latter. To avoid adding a rigid sleeve around the elastomer, it is preferred to perform injection of the flexible elastomer 204, 216, 226 around the conductor 210, 214, 224 but within the previously fitted shell 222. In order to enable this injection over the whole of the internal surface of the shell 222 and to expel the air which may remain in this narrow volume, the shape of the elements is chosen in precise manner.

Figure 5B:
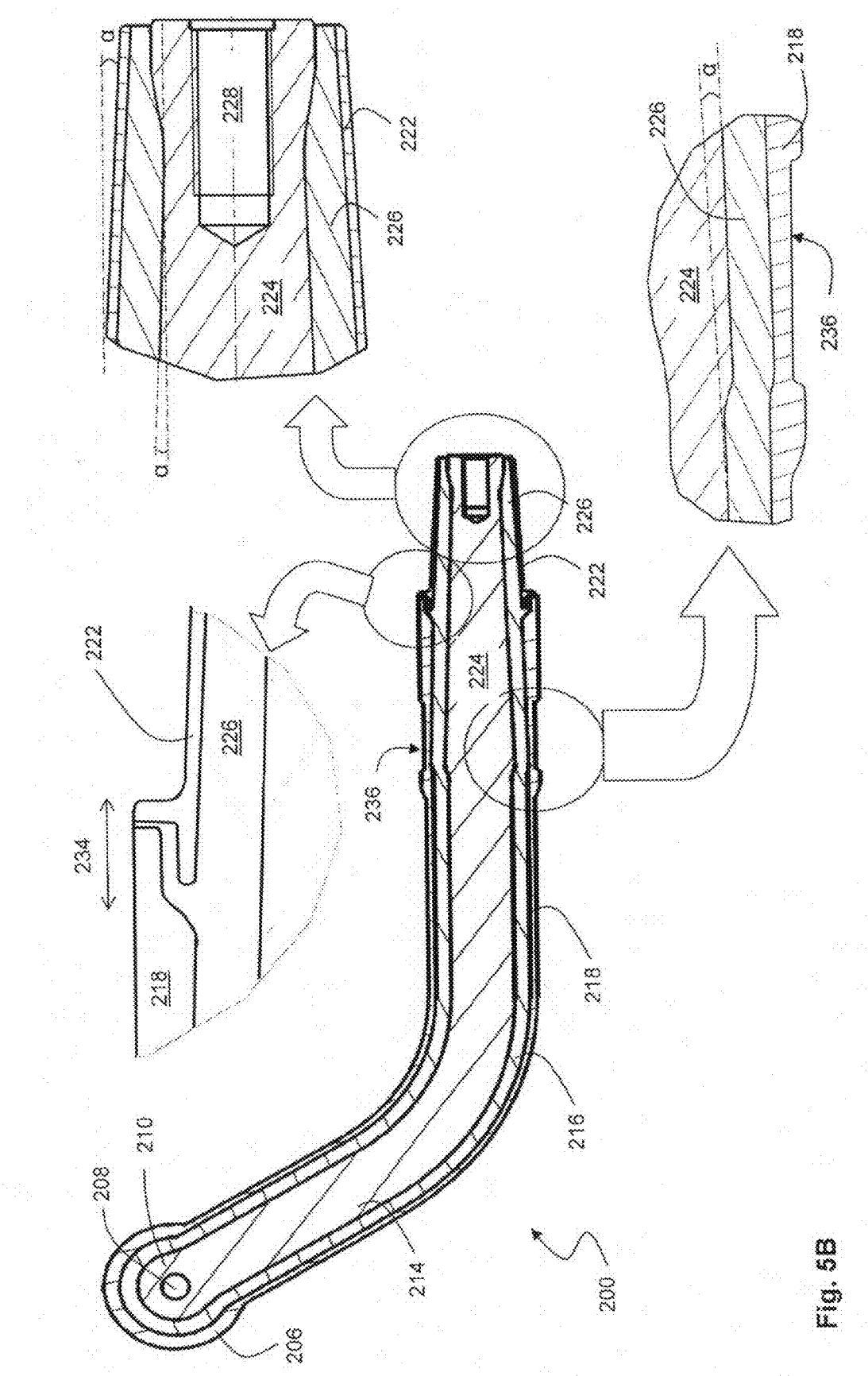

In particular, in a preferred embodiment illustrated in FIG. 5B, the shape of the metal insert 224 at the level of the customer end-piece is modified so as to be tapered with substantially the same slope as the slope imposed on the shell 222 by the norm. For example, for an end-piece of C type, the external slope $\alpha$ forming the cone is equal to 3°. At the level of the shell 222 advantageously of constant thickness, comprised between 2 and 5 mm (a sufficient thickness to ensure the relative rigidity necessary for easy draw-in of the input and feeder cables 2, 3), the insert 224 takes this slope $\alpha$. The thickness of elastomer over-moulding thus remains constant, preferably greater than 5 mm, for example about 6 mm, which makes for easy flow and especially vulcanization and therefore the absence of formation of bubbles inside the insulator or at the interfaces between materials. As for the connection device, the interfaces between the deformable insulator and the shell, respectively the insert, are hermetic.

The length of the tapered part of the conducting insert 224 is greater than the length of the part of end-piece 220. The part of end-piece 220 is in fact designed directly for fitting of the cable connection, but the part of connector 200 salient from the enclosure of the substation 1 is longer. Advantageously, the conducting insert 224 is tapered over the whole portion 230 of connector coming from the outside of the substation and serving the purposes of assembly, in particular to withstand the forces able to be exerted at the junction between the horizontal connecting end-piece 220 and the vertical wall of the enclosure, therefore with a maximum thickness of metal which enables the mechanical forces to be withstood at this level. On this securing part 232 extending the end-piece 220, although it is possible to extend the shell 222, it is preferred to over-mould the insert 224 directly by the insulator 226, without any rigid protection. Advantageously, in order to simplify the manufacturing process, the thickness of over-moulding is kept at this level.

Once the conducting core+elastomer+shell assembly has been produced, shielding of the "free" elastomer is performed, i.e. the elastomer which is not enclosed in the shell 222.

Shielding is in particular performed by an over-moulding 218 by the same elastomer as the insulating support 216, but charged with conducting particles, and identical to that of the link part 212. To achieve unity in the connector 200, the shape of the shell 222 is optimized at the level of its junction 234 with the securing part 232. In particular, as illustrated, if the thickness of the shell 222 is constant over the length of the end-piece 220, its end is formed with the form of a notch enabling inclusion of a part of rigid shell 222 inside a thickness of insulator 226. The over-moulding shielding 218 preferably also comes around this end part to form four layers on the portion of junction 234 illustrated in FIG. 5B, in particular in order to reduce the electric field in the stopping area of the shielding.

It is possible to fit a shielding 218 of constant thickness around the securing part 232, naturally with the exception of the end around the shell 222. However, in an advantageous embodiment, a portion of the securing part 232 is associated with elements enabling fixing to be performed on the enclosure of the substation 1, and it is preferable to provide a housing 236 for these elements. Thus, as illustrated, over a length of 45 to 50 mm, the external surface of the securing part 232 is of constant diameter, smaller than the diameters surrounding it, to form an annular groove 236 on which it is possible to couple a rigid element 240 able to be secured to the wall of the functional units 4, such as a sheet plate.

Figure 5C:
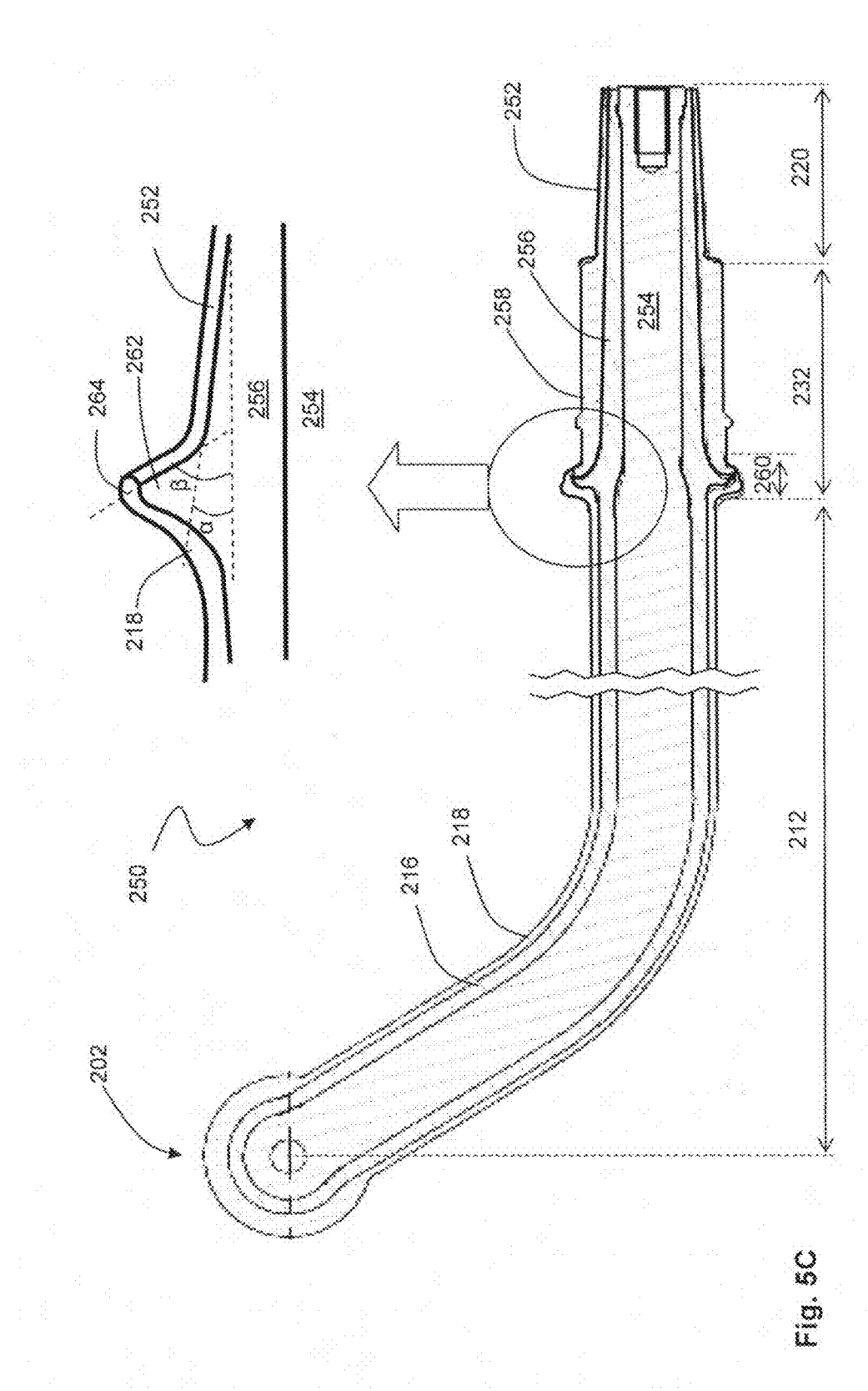

Alternatively, in particular for certain less frequent standardized end-pieces 220, manufacturing of inserts 224 with a tapered end can prove very costly, all the more so as the injection mould would also have to be modified to keep the thickness constant. It may then be preferred to modify the connector 250 and to use a more conventional insert 254, with an end cylindrical in revolution up to its end, illustrated in FIG. 5C. In this case, to fluidify filling of the space between shell 252 and insert 254, it is recommended to have a thickness of increasing gradient of insulating over-moulding 256 between the end of the end-piece 220 and the securing part 232. Advantageously, the shell 252 keeps its constant thickness, and the slope a defined by the norm is kept for the over-moulding thickness.

In this framework, the insert 254 remains of small diameter in the securing part 232. In order to take up the mechanical stresses, it is recommended for the rigid shell 252 to also be extended around the securing part 232. The thickness of the shell 252 is preferably kept there, and strengtheners of rib type 258 are associated thereto on the outside. Other reinforcement solutions can be chosen such as thickening of the shell or metal strengtheners.

Both for reasons of controlling the electric field and of achieving tight interfaces and bubble-free moulding of the elastomer material 256 between the shell 222 and the insert 254, the above-mentioned general shape is not kept on an end area 260. In particular, the internal slope $\beta$ of the shell 252 is increased so as to create a sort of funnel 260 at this level. Over a length of 19.5 mm, the slope is about 24°, therefore with an opening of the shell 252 at the level of the securing part 232 of 100 mm.

The final horn 250 is thus obtained by fitting of the shell 252 around a metal insert 210, 214, 254 centred in said shell 252, and then over-moulding around the insert 210, 214, 254 and in the shell 252. At the level of the end area of the shell 252, over-moulding of the elastomer 256 is performed in such a way as to form a rim 262, so that the insulator at this level is of maximum thickness. The over-moulding thickness is preferably constant around the connection device 202 and rod 214. The shielding is extended on the neck 260 of the link part 212 to completely cover the elastomer at this level. The shielding coating 218 forms a rim 264 around the shell 252.

A connector 200, 250 for the preferred embodiment of the invention thus comprises four distinct parts: a connection device 202 designed to come into contact with a similar device, a link part 212 the external surface of which is formed by the elastomer shielding coating 218, a securing part 232 the external surface of which is formed by a metallized rigid plastic 252 or an elastomer shielding coating 218 of larger external diameter than the link part 212, and a connecting end-piece 220 designed to be inserted in a suitable cable end-piece 2, 3 of tapered shape and coated with plastic 222, 252, an elastomer 226, 256 embedding a conducting insert 224, 254 that possibly comprises a tapped hole 228 being apparent on the end surface of the latter. Securing means 240 are advantageously securely fixed on the securing part 232, these means particularly comprising a strengthening flange 242 and a plate 244 which can be secured directly to the wall of an enclosure of the substation 1, so as to take up the forces due to coupling and to guarantee a constant orientation of the protuberant connection part 230 (FIGS. 6).

Figure 6B:
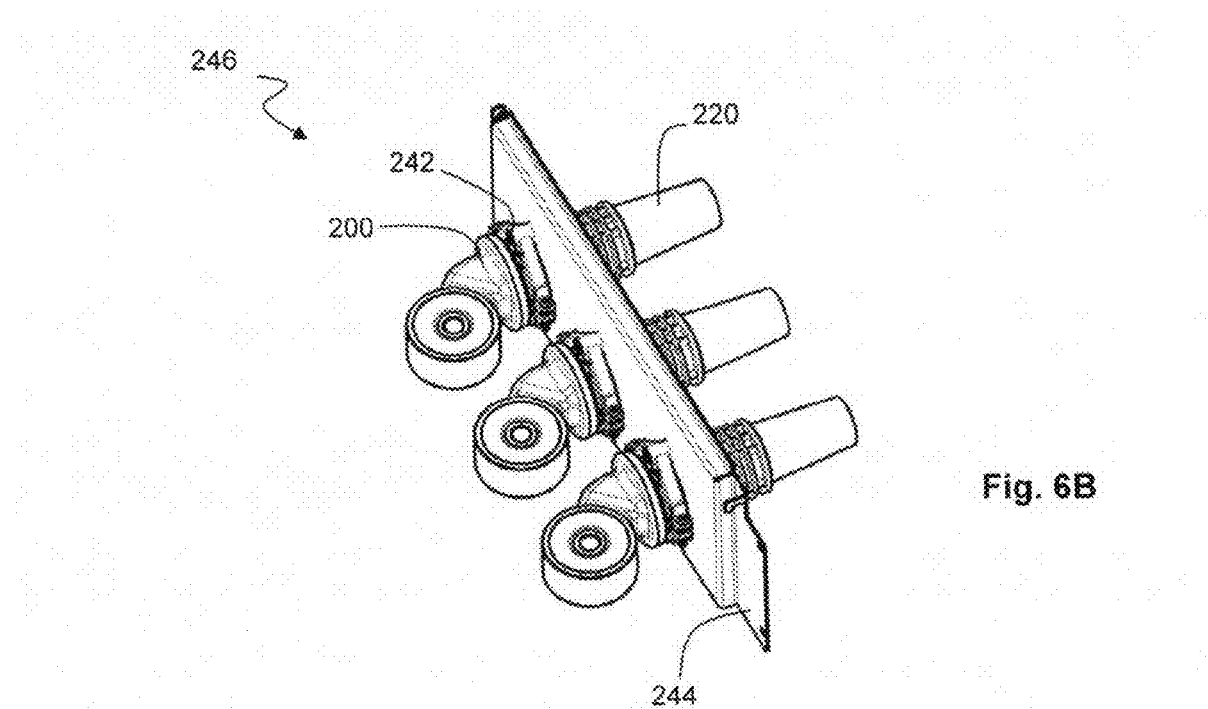

These connectors 200, 250 are normally directly associated on the terminals 60 of the switchgear cubicles 50. In a connection geometry which is a priori obvious, illustrated in FIG. 6A, the connecting end-pieces 220 are located facing the cubicles 50, or slightly offset according to the orientation of the horn 200, 250, on a side wall of the functional unit 10. In particular, as illustrated in FIG. 6B, the securing means 240 can secure three horns 200 to one another in order to simplify assembly and to give the structure an enhanced rigidity. In particular, a clamping system 242, for example a metallic system with fixing of two complementary parts around the gripping part 232, completed by a sheet plate 244 provided with suitable apertures, enables positioning and/or securing to be performed within the enclosure 12 of the functional units 4. This assembly 246 can then be located at the top or especially at the bottom of the cubicle 50 when the latter comprises symmetric terminals 60.

It does however appear desirable to provide front (or rear) access for the inputs and outputs 2, 3. In fact, as also illustrated in FIG. 1, the side wall of some functional units 4 is not accessible, such as for example for the second input $2_2$ to the unit surrounded by two other functional groups $10_1$, 20. As the switchgear cubicles 50 are aligned orthogonally to the connection panel, and as it is moreover desirable for the three cable connectors 200, 250 to be aligned horizontally, the connectors 200, 250 according to the preferred embodiment are produced with a bend in order to enable front connection of the alignment poles depthwise in the functional unit 4. On account of the difference of orientation, it is further desirable for the length of the link part 212 of the connectors to be variable in order to enable this offset.

Figure 6C:
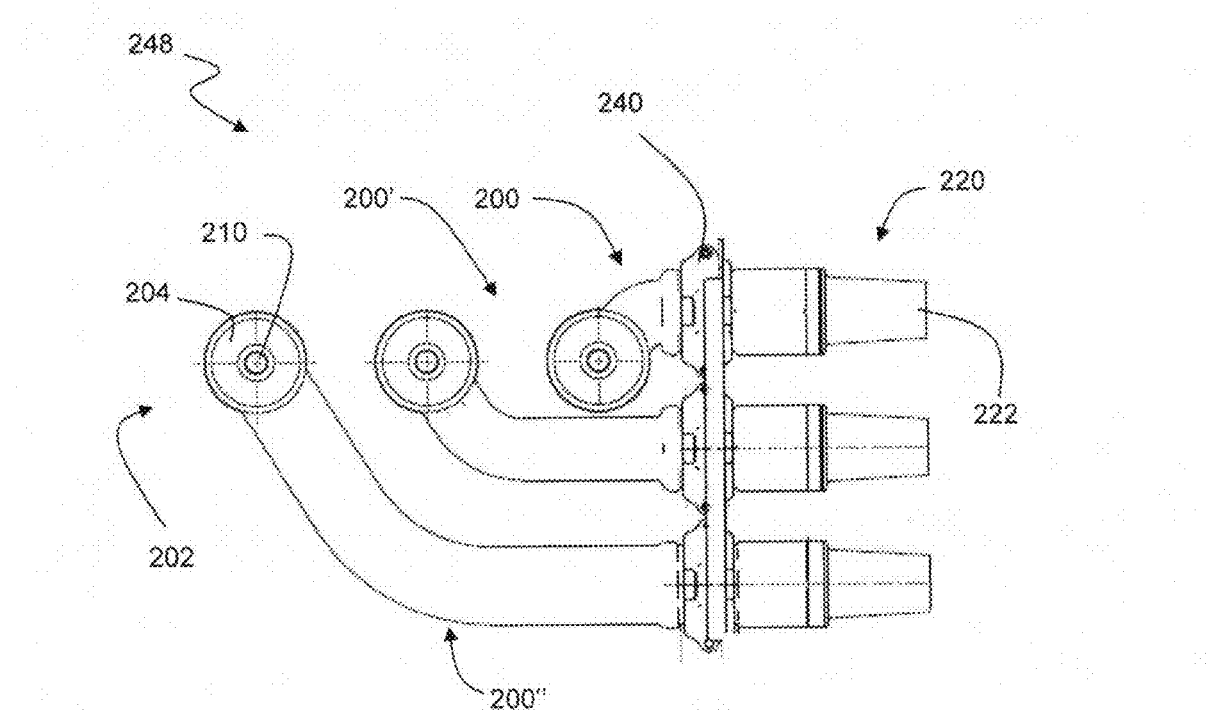

In order to facilitate the different types of connection, it has been ascertained that three types of connector 200 are sufficient, with in particular a simple adaptation of the link part 212. Thus, as illustrated in FIG. 6C, three connectors 200, 200', 200'' comprise link parts 212 of different lengths, in particular about 60, 200 and 340 mm. It is further advantageous to also provide here a securing element of three connectors 200, 200', 200'' to form a unitary assembly 248 which can be coupled directly to the terminals of three apparatuses aligned in the depthwise direction of the substation, and to a front wall of the same substation 1.

Thus, to simplify assembly of the connectors in a MV substation 1, a support 240 composed of two complementary elements surrounding the set of three connectors at the level of housings provided for this purpose is fitted around the securing parts 232. A set of connectors 246, 248 is thus obtained comprising three aligned standardized end-pieces 220 affixed to a plate 244 and connected to three connection interfaces 202 which are also aligned, according to the case, in parallel direction to the end-pieces or orthogonally, with the same spacing. To couple this set of connectors 246, 248, it is advantageous for the receiving wall of the enclosure 12 of the functional unit 4 to comprise fitting means, in particular prongs and/or hooks in which the plate 244 of the set of connectors 246, 248 can be accommodated. Once the set of connectors 200, 250 has been coupled to the enclosure, clamping of the connection interfaces 202 on the apparatuses 50 of the functional group 5 is performed, and coupling is then completed by clamping on the enclosure of said unit 1. Assembly is easy to perform, without any specific tooling, but enables the end-pieces 220 to be aligned and the assembly to be rigidified so that the cable connections do not budge and a draw-in/draw-out force on the connectors does not unduly stress the connections of the functional unit 4.

In particular, in the preferred embodiment of substation 1, all the bottom terminals 60 are located at the same height, just under the control compartment 5' and in the bottom compartment 8. Preferably, the height of the connectors 200 can thus be constant, in particular at 700 mm from the ground, in order to facilitate assembly and maintenance operations.

It is further possible to postpone the choice of customer connection wall on the functional unit 4, or even to modify it during the lifetime of the substation 1, for example when units are added. For this purpose, it is provided for several of the walls of the enclosure of the functional units 4 to be provided with means for fitting the set of connectors 246, 248, with the possibility of two locations, i.e. at the top of the switchgear unit 50 and at the bottom, at a final height of 700 mm (or 500 mm in certain cases) when the group 5 is fitted on the bottom compartment 8. The following configurations are preferably scheduled: front panel at the bottom, rear panel at the top and at the bottom, side panels at the top, configurations which can each be required in situ when erection of the substation is performed.

Naturally, the embodiments are given for indicative purposes and alternatives are possible, in particular in the general shape and size of the different parts of the connector, but also in the accessories which are attached thereto or the materials used, such as for example as far as the shielding by earthed conducting coating is concerned. Likewise, the arrangements between the elements can be modified.

A distribution substation 1 according to the invention further comprises measuring means which can be of various kinds. In particular, as presented in the foregoing, a measuring coil or a measurement sensor of any technology can be fitted on the securing part 232 of the connection horn 200. It is also possible to use a sensor as described in the document EP 2,253,963 at the level of a connection device 102, 202.

In a preferred embodiment, the substation 1 according to the invention comprises a functional group 40 dedicated in particular to measurement. As specified in the foregoing, it is preferable for the enclosure 42 of the measuring group 40 to have the same characteristics as the switchgear groups, in particular as far as its dimensions and architecture are concerned. Alternatively, it is possible to dimension the measuring group 40 as an association of several switchgear groups 10 so that its width is for example twice that of the others. It is thus possible to always use the same type of connecting bars 100 to connect the units 4 to one another, and to only require a single length of bar 100 for the substation 1.

Figure 7:
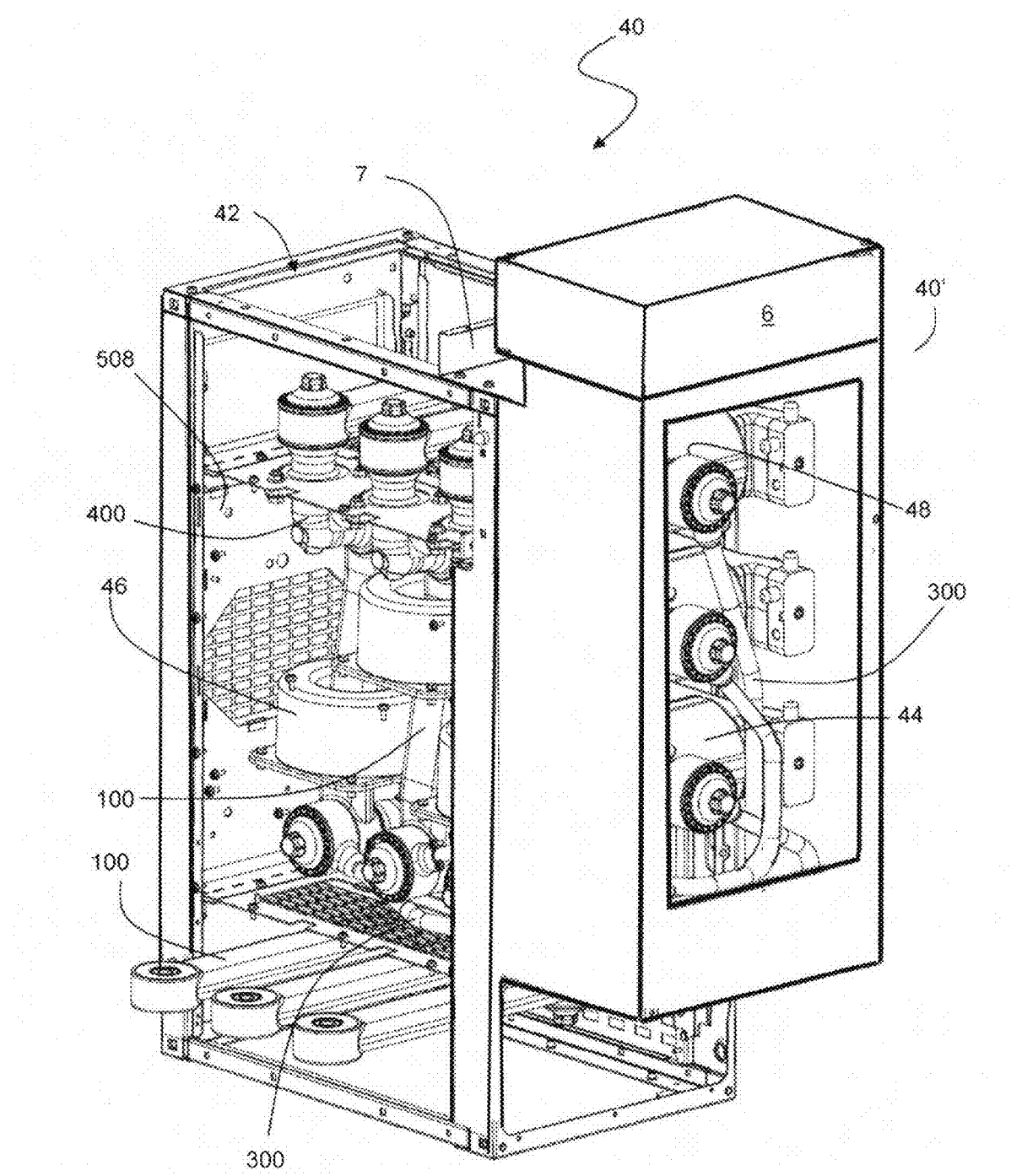
FIG. 7 represents a functional measuring unit for a medium-voltage distribution substation.

A measuring group 40, illustrated in FIG. 7, for a MV substation 1 comprises in usual manner voltage measuring means 44, which can be of conventional design, but advantageously with shielded solid insulation. Current measurement sensors 46 can also be provided, also of conventional design, preferably comprising coils through which the shielded current conductors pass. The signals representative of the measured parameters are, as usual, transmitted to a monitoring unit which is advantageously housed in the LV compartment 6. The number of measuring means 44, 46 naturally depends on the data required by the user and on the subsequent processing which is scheduled. However, whatever the functional apparatuses it contains, the measuring unit 40 is of similar design, which will be described for non-restrictive purposes for one voltage measurement and one current measurement per phase, extrapolation to the other configurations being immediate.

As schematized in FIG. 1, it is frequent for the functional measuring units 40 to be positioned in the center of the substation 1 so that lateral access to the inside of the enclosure 42 is not possible. Rear access is likewise complex once the substation 1 has been installed. The different measuring means 44, 46, and if possible their connection means, therefore have to be arranged in such a way as to allow access via the front of the substation 1 or via the top. According to the preferred embodiment, the voltage transformers 44 are positioned for direct access via the front of the enclosure 42. In particular, the input terminals 48 of the three transformers 44 are aligned, one underneath the other, directly behind the door of the enclosure 42. The ergonomics of the distribution substation 1 are greatly enhanced. Indeed, in case of maintenance or to replace the sensors 44, it is easy to access the terminals 48. Likewise, during a power frequency test, disconnection of the sensors 44 is facilitated. To further enable direct access to each of the current sensors 46, the latter are located behind the frontal alignment, and preferably in a horizontal plane, with corresponding opening of the roof of the substation 1. In particular, the current transformers 46 can be secured to one another, with an identical distance between their axes to that of the switchgear cubicles 50, to enable connection via the connecting bars 100. The current is in fact input to the measuring group 40 via connecting bars 100 from the adjacent group 20.

To connect the voltage sensors 44 to the current inputs from the connection devices 102 of the bars 100, it is advantageous to be able to use cables 300 which use the same flat interface system as described in the foregoing. In particular, according to a preferred embodiment of the invention, all the connections internal to the substation 1 are shielded and made in similar manner, and a suitable cable 300 has been developed.

Figure 8A:
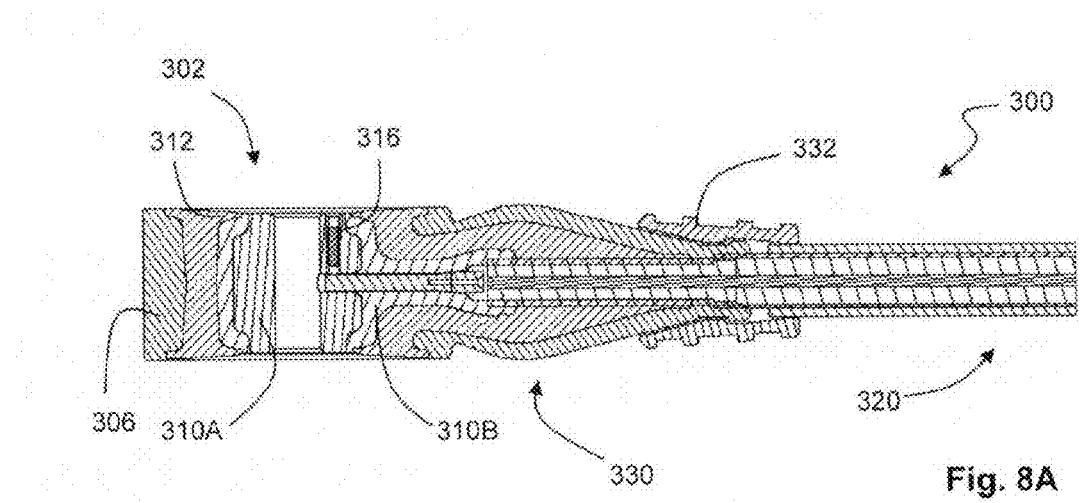
FIGS. 8A and 8B illustrate a cable for connection in a distribution substation according to an embodiment of the invention.
Figure 8B:
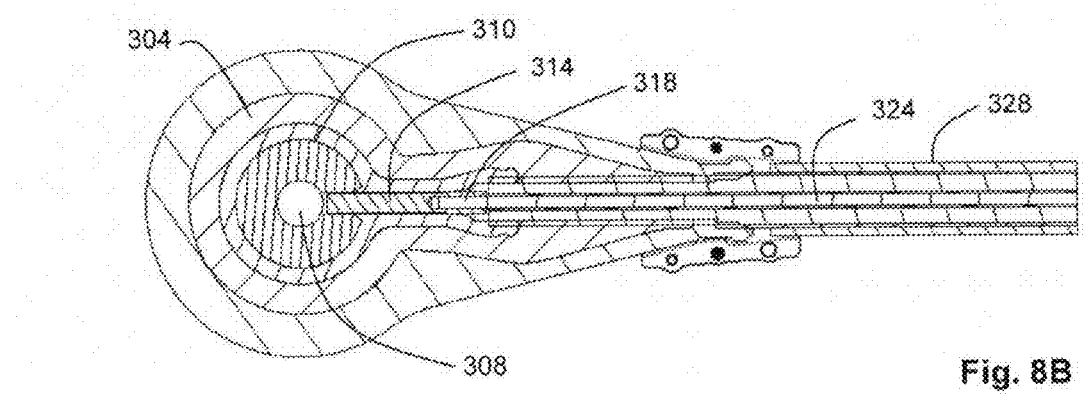

The cable 300, illustrated in FIGS. 8, is provided with a similar connection device 302 to the connection devices 102, 202 of the bars and connectors, with an insulating support 304 made from deformable material, in particular EPDM, surrounded with the exception of the connection surfaces by a shielding 306 advantageously formed by an over-moulding of the same charged material. The compressible material is over-moulded around a conducting insert 310 so that the interface between the two is tight, devoid of free spaces, with the thickness of the support 304, defined between its two opposite connection surfaces, being greater than the height of the conducting insert 310 defined by the distance between its two connecting surfaces, at rest, and equal to the latter in the clamped position by orthogonal compression of the insulating support 304.

As far as the cable 300 is concerned, a hard-wired conductor 320 has to be secured to the insert 310. To simplify the coupling, the conducting insert 310 is formed in two parts: a rigid central core 310A comprising the connecting surfaces and in which there is drilled a hole 308 for passage of the clamping means 80, over-moulded by a conducting elastomer 310B. Preferably, the conducting over-moulding 310B, of the same nature as the insulating support 304 but charged for example with conducting carbon, is distant from the connecting surfaces so that the material of the insulating support 304 forms a neck 312 at each end so as to only leave the conducting core 310A flush at the level of the connecting surfaces.

The conducting insert 310 comprises a lateral protuberance 314 provided with connection means of the conductor 320. In particular, the protuberance 314 is surrounded by the same conducting elastomer 310B, in its continuation. Coupled to the insert 310 by suitable means, in particular by clamping 316, it has drilled in it a hole 318 in which the end of the conductor 320 is for example crimped.

As is usual, the conductor 320 of the cable is, in its largest length and with the exception of the end coupled to the protuberance of the insert 310, coated with an insulation 324 which can be a three-layer insulation. In particular, after the end has been bared, the insulator 324 can be staged. The insulator 324 of the conductor is inserted at its end part, preferably forcibly, in the hole 318 of the conducting protuberance 314 to provide the dielectric strength. On its largest length, the hard-wired conductor 320 is further covered by a shielding coating 328, which may be covered by a protective sheath. The dimensions of the cable 300, and in particular its flexibility, are determined according to the use.

On the non-sheathed and non-shielded part of the cable, the assembly formed by the conductor 320 and connection device 302 is over-moulded by the insulating material, in unitary manner with the support 304, to obtain a sleeve 330 from which the length of cable coated with shielded insulator extends. This sleeve 330 is also coated with the same shielding coating 306 as the connection device 302. Strengthening means of collar type 332 are advantageously fitted at the junction between the two shieldings.

Connection to the other functional units 4 of the measuring group 40 is therefore performed by three flat-interface connecting bars 100, the three bars 100 forming a horizontal plane preferably at the bottom of the group 40. A branch-off of the current lines is made to supply voltage measuring means 44, which are for their part located at the front of the group 40, one above the other in vertical alignment. To perform connection, the measuring means 44 are coupled by cables at least one end of which comprises a connection device by flat interface 302 connected to the bars 100 and associated with the measuring means 44. The cable 300 is advantageously symmetric, with two identical connection devices 302; the voltage measuring means 44 are adapted, with a similar connection terminal 48 to the terminals 60 of the switchgear cubicles 50 and in particular with an axial conductor coated in an insulating support which is longitudinally coated by a shielding, such that the connection surface is a disk in which a connection surface of the conductor is centred. This further enables maximum advantage to be taken of the properties of the voltage measuring means 44, which are insulated and shielded, and of their location.

Advantageously, for ergonomic reasons, the voltage measuring means 44 are located in a compartment 40' functionally separated from the measuring group 40 but not partitioned for normative reasons, for example of the same depth as the control compartment 5' of the switchgear groups 5. The ergonomics are thus optimal. Furthermore, the power lines being placed at the rear of the voltage measuring housing 40', the sensors 44 are located away from any electric arcs. In particular, the cables 300 act as fuses on account of their small cross-section. Inversely, in case of an arc at the level of the voltage sensors 44, the cables 300 also act as a fuse, preventing the arc from propagating and preventing the fault from degenerating into a three-phase fault. Safety of the operating personnel is enhanced.

As stipulated in the foregoing, a cable 300 could be connected directly on a bar 100, but also on a terminal 60 of an apparatus 50. However, on account of the required flexibility, it is hardly conceivable for its cross-section to enable it to connect the apparatuses 50 of two functional units 5 to one another. The connections internal to the units 4 in fact advantageously recommend the use of the same, rigid, connecting bars 100, which enable a better organization of the inside of the enclosures while at the same time reducing the number of industrial references.

In particular, to connect two switchgear cubicles 20, 30 separated by a measuring group 40, it is possible to associate two bars side by side, as illustrated in FIG. 3A. When it is recommended to connect a terminal 60 at one end of a cubicle 50$_g$ to a terminal at the other end of the latter (FIG. 1), in particular in the presence of a functional measuring unit 40 comprising current sensors 46, the bar 100 of suitable dimensions can be used, with connection auxiliaries 400 between the connection devices 102 enabling reorientation of the connection surface in order to connect the connection means at the top and bottom of the group 40. This configuration with displacement on the input of the switchgear cubicle 50 of the group 30 is particularly advantageous for fitting the current sensors 46 around a length of bar 100 so as to accept substantial sizes of sensors 46.

Figure 9:
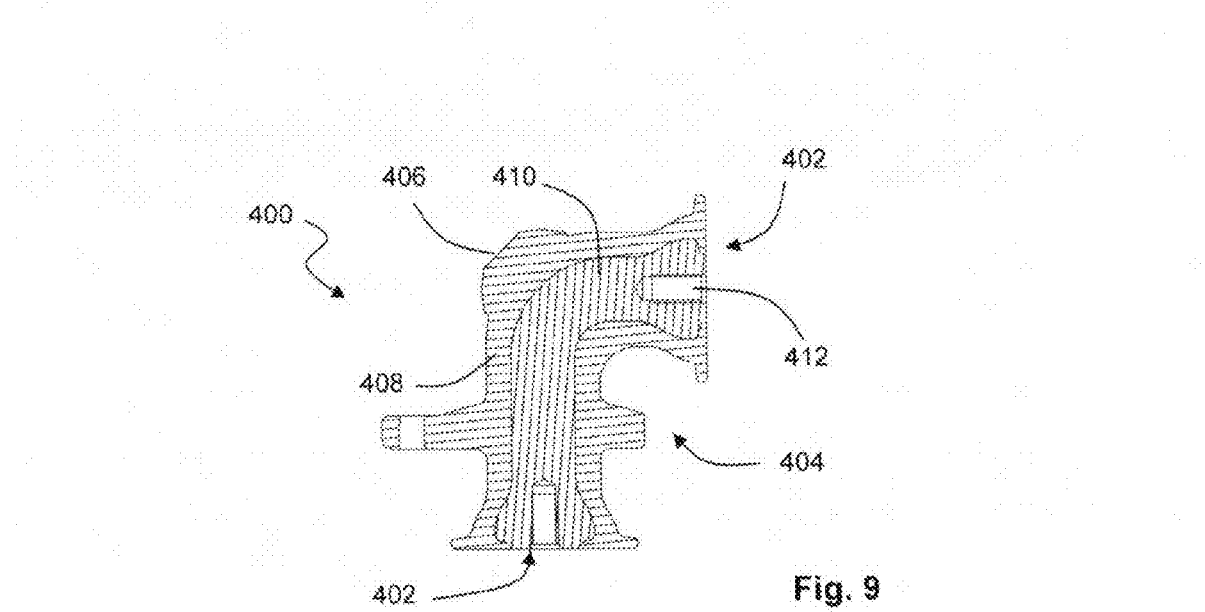
FIG. 9 represents an element for connection in a distribution substation according to an embodiment of the invention.

In particular, according to a preferred embodiment, the substation 1 according to the invention is provided with connection elbows 400 comprising two connection devices 402 connected by a right-angled link part 404, illustrated in FIG. 9 and preferably shielded. In a preferred embodiment, the elbow 400 is formed in a similar configuration to that of the terminals 48, 60, i.e. from epoxy type material 408 overmoulded around a metal insert 410 of suitable size and drilled 412 to enable the use of a blanking device 80 performing clamping against the connection device 102 of a connecting bar 100. Alternatively, in particular when the elbow 400 is to be used directly on a terminal 60 of an electric switchgear unit which is itself constituted by a non-deformable material, the insulation over-moulded around the metal insert 410 can be made from elastomer.

Thus, as the set of connections are insulated and shielded, the measuring group 40 only comprises elements tested for their dielectric performances and in particular complying with the normative standards for the IEC. The functional measuring unit 40 can therefore be considered as eliminating the risk of an internal arc as far as possible, which makes for enhanced safety.

Although all precautions are taken, internal arcs may occur in the functional units 4 of a MV substation 1. An internal arc fault is a short-circuit able to occur in an electric equipment unit by loss of dielectric rigidity between two conductors at a different potential, or between a conductor and the ground of the equipment, the causes of which may be consecutive to overheating of conductors, to ageing of insulators, to forgetting a tool between two non-insulated conductors when performing maintenance, to an animal entering a live equipment unit, etc. This fault, which has a duration which can exceed one second before the line-side protection devices trip to eliminate the short-circuit, is rare, but its criticality makes it necessary to master its effects. The internal arc in fact comprises a first shock wave phase of 0 to 5 ms the effects of which are mechanical, a second pressure increase phase (between 5 and 30 ms) and a third gas expulsion phase, with a very high thermal release.

If the shock wave causes uncontrolled mechanical deformations and breaking of the securing elements, outgassing accentuates the mechanical deformations and weakening of the securing elements even further. Thus, for a medium-voltage substation 1, possible deterioration of the equipment has to be anticipated, above all of the closed enclosure, i.e.: loss of tightness or perforation of the external enclosure, breaking of the door closings and panels and/or of the mechanical fixings, very high stresses on the structure of the equipment, expulsion of parts after breaking.

The MV substation 1 according to a preferred embodiment of the invention is designed to distribute and limit the pressure increase and to absorb the mechanical energy that is released. In particular, each functional unit 4 of the distribution substation 1 is provided with an additional compartment 9, on its rear panel, acting as gas distribution chimney. Its volume increases the volume of the functional unit 4, but above all, the chimney 9 enables the breaking gases to be distributed within the substation 1, so that the gases can occupy a maximum volume of the substation 1, without damaging the critical equipment. The side walls of the chimney 9 are provided with wide passages 500; the separating walls with the functional group 5 are limited to the standards required to form IP2x (Ingress Protection Rating) compartments, and are provided where they are solid with check valves and/or other high-speed opening means.

As illustrated in FIG. 10A, a chimney 9 is formed from uprights 502 and cross-members 504 delineating a rectangle on which panels forming walls can be secured. The chimney 9 preferably corresponds to 15 to 30% of the volume of the functional unit 4. In the substation 1, the side walls of the chimney 9 advantageously comprise large empty spaces 500, separated by support cross-members 506 arranged in advantageously regularly spaced apart manner. The separating wall internal to the substation 1 is for its part preferably provided with a sheet plate 508 in which holes can be drilled. Thus, if an arc occurs in a functional unit 4, the gases escape from the latter to the chimney 9 which distributes them in the neighbouring chimneys.

To increase the gas outlet volume even further and to reduce the pressure generated by the arc gases, the substation 1 according to the invention takes advantage of the residual space situated in the bottom compartments 8 of the functional units 4, a space used to run the cables. Due to the connection system used, it is in fact possible to organize the connections in optimum manner and, according to a preferred embodiment, running of the cables is concentrated in the front part 8' of the functional unit 4, underneath the control compartment 5' of the functional groups 5 where access to the connecting end-pieces 220 is located. The part 510 located under the electric switchgear units thus becomes free, and it is chosen to place this second housing in direct connection with the chimney 9, so that the gases can be distributed freely in the whole volume of the unit 4, with the exception of the control and cable compartments 5', 8' protected by panels complying with the IP2x criterion.

The bottom compartment 8 is thus separated into two, with a separating wall 512 between the front housing 8' for passage of the cables, and a rear housing 510 forming a tunnel. The rear housings 510 of the functional group s 5 are separated from one another by a minimum amount of obstructive elements, and in particular it is advantageous for only the uprights and cross-members necessary for support of the functional group 5 to form their side separating walls between units 4, as for the separating wall with the chimney 9. A tunnel 510 common to the substation, and which can represent from 15 to 30% of the volume of the enclosure of the substation 1, is thus created, coupled to the volume of the chimneys 9. The gases can therefore be distributed in a substation volume increased by 25 or 40%, or even doubled, compared with the simple volume of the functional groups 5. Furthermore, on account of the large openings between the tunnel 510 and the chimneys 9, the gas is directed mainly into these volumes 9, 510 and only enters the functional groups 5 of the units other than the one at fault in a less brutal, secondary manner, which enables the apparatuses concerned, themselves designed to withstand the heat given off in certain cases, not to be damaged by blowing.

It is advantageous to provide outlet check valves 514 between the housing 8' before passage of the cables and the tunnel 510, in order to enable a possible overpressure generated in particular by an arc in the cable housing 8' to also be distributed in the gas outlet volume 9, 510; reverse flow is not favoured.

The chimney 9 can further be provided with means enabling controlled outlet of the generated gases. In particular, a filter 516 as described in FR 2,839,817 and/or a check valve enabling outlet can be provided on an outer wall, in particular a rear wall, or on the roof. Alternatively, under certain conditions, the enclosure of the substation 1 and therefore of the chimneys 9 is tightly sealed, with the presence of a gas outlet pipe sucking the gases when overpressures occur, for example hollowed out under the tunnel 510 of the substation 1 and accessible via a check valve 518. Due to the design of the apparatus, the choice of the outlet system (direct or via a civil engineering structure, with or without a filter, at the top or at the bottom) can be postponed, or even modified, with the substation 1.

Although the volume of the substation is greatly increased by means of the above system, to limit the potential damage due to the temporary overpressure generated by certain arcs even further, the chimneys 9 are provided with means 520 enabling at least a part of the mechanical energy to be absorbed. In particular, as illustrated in FIG. 10B, the support cross-members 506 of the chimneys 9 are provided with directed expansion means formed by drawing of a metal sheet. The drawn length of said cross-members 506 is larger than the depth of the chimney 9 and their visible length when assembled on the substation 1.

The substation MV 1 according to a preferred embodiment thus comprises a mechanical device 520 with controlled deformation to absorb energy, which further enables an additional volume to be given for the purposes of reducing the pressure. Controlled deformation also enables the mechanical stresses on the components and securing elements to be mastered, in particularly the panels forming the outer walls of the enclosure of the substation 1, to maintain a good tightness level and to contain the gases in the outlet pipes.

In particular, the outer walls of the chimney 9 which are internal to the substation 1 are formed by a sheet plate 522 which is provided with substantially rectangular openings 500 forming the majority of its surface, separated by the support cross-members 506. As illustrated, the cross-members 506 of the chimneys 9 comprise at least one V-shaped fold 520 towards the inside of the chimney 9 which are dimensioned and designed to deform in the plastic area of the material. Two folds are preferably fitted in order to enable high-speed opening of separating check valves 524 while at the same time optimizing the number of operations to make the V. In particular, all the folds have a depth p=30 mm for a separating distance e=25 mm, the width of the chimney 9 being about w=200 mm (which corresponds to a maximum extension of 25% of said width).

Furthermore, on account of the fact that the outer panels of the substation 1 have if possible to remain in place in tight manner including in case of an arc and of deformation, the cross-members 506 are designed to direct deformation of said panel. In particular, the width d of the cross-members 506 is not constant over the height of the substation, with for example cross-members of greater thickness at the heart of the chimney 9. Preferably, for a height h=1350 mm, the distribution comprises a "thin" central cross-member ($25<d<30$ mm, preferably d=28 mm), surrounded by two "thick" cross-members ($35<d<45$, preferably d=40 mm) themselves surrounded by "thin" cross-members. The end cross-members, which are fitted at the level of the edges 504 of the chimney 9, advantageously have an intermediate thickness (for example $30<d<35$, preferably d=34 mm), their deformation having to be minimal in case of an overpressure.

The cross-members 306 are advantageously fitted at the level of the fixing points on the enclosure profile. However, for design reasons, this fitting may not be possible. It is then advantageous to "off-centre" the openings 500 of the wall 522 concerned so as to have a rigidification at the level of the inner part of said wall, which enables the forces on the cross-members 506 to be better distributed. In particular, a solid part 526 with a thickness m=30 mm is kept on one side. Cutting of the cross-members 506 is moreover performed with the absence of sharp angles, with linking arcs of a circle the radii of which are optimized and may differ according to the heightwise location of the cross-member.

If the recommended solution, with a cut sheet plate 522 to form the side wall, enables the assemblies and management of the stocks to be simplified, an alternative can consist in securing the cross-members 506 directly on the uprights 504 of the chimney 9, in particular by welding. In this case, the cross-members 506 may not be identical, including in so far as the distribution and the number of folds, for example one, two or three folds, or even the shape of said folds within the wall, are concerned. The innovation in fact concerns a suitable design by producing deformable parts with variable cross-sections enabling elongation according to the different pressure levels, in integrating and mastering the deformable areas in the cubicle to limit the stresses on the structure and the fixings. The device 520 solves the random and non-repeatable mechanical deformations of the enclosure in the two phases of the internal fault and improves removal of the gases.

The substation 1 according to the invention is therefore designed to withstand arcs, and all the apparatuses and connectors which it comprises are also designed in the same way. In particular, the connectors are shielded, as are the apparatuses, which further limits propagation of arcs. In addition, to optimize the modularity options, the substation 1 advantageously comprises a single technology for the different current interruption devices 50. The technical characteristics of the switchgear cubicle 50 are optimized for the use which is made thereof, but the operating principle remains identical, which simplifies maintenance and monitoring operations. In the same way, all the connections 48, 60, 100, 200, 300, 400 are made on the same principle, which is in additional easy to visualise and to which it is easy to have access. All the connections are therefore made in identical manner and the connecting elements are interchangeable: inversion of two units 4 is easy without requiring additional references for the connectors.

Advantageously, the dimensions are standardized. In particular, the switchgear cubicles 50 are of identical size whatever their parameter settings, the distance between their terminals 60 being compatible with the distance between the axes of the functional units 4 so that the same connecting bars 100 can be used in the horizontal or vertical position. In particular, for this restriction in the number of references for the connecting bars 100, 100', the external size of the functional units 4 is constant, to within an integer factor. Furthermore, when all the options are taken, it is possible to change the input location 220 of the external cables at the last minute, or even when the substation has already been used, and to add functional units 4 simply or to extract units temporarily for maintenance reasons for example. The cable inputs are moreover all made at the same height.

The invention claimed is:

1. A functional measuring group for a medium-voltage distribution substation comprising a substantially rectangular enclosure, three current input connection means, three current output connection means, and voltage measuring means, wherein:
   the input and output connection means are aligned, respectively, in two parallel planes of the enclosure;
   the enclosure comprises a first housing for the voltage measuring means, the compartment of the enclosure being directly accessible via an access panel of the enclosure orthogonal to the planes of the connection means;
   the voltage measuring means comprise connection terminals located in a plane parallel to the access panel;
   the connection terminals of the voltage measuring means are connected to the connection means of the group with flexible cables.

2. The functional group according to claim 1 comprising three shielded voltage sensors the terminals of which are aligned orthogonally to the plane of the connection means of the group.

3. The functional group according to claim 1 wherein the connection terminals of the voltage measuring means comprise an axial conductor embedded in an insulating material which is partially coated by a shielding so that the connection surface of the connection terminal is a disk in which a connecting surface of the conductor is centred.

4. The functional group according to claim 3 wherein the connection cable connecting a terminal of the voltage measuring means to the connection means of the group is provided with a connection device which comprises:
   a support of the insulating material delineated by two opposite connection surfaces that are substantially parallel and superposable on a disk;
   a conducting connecting insert integrated in the insulating support and opening onto the two connection surfaces at the level of two parallel flat connecting surfaces that are superposable on the connection surface of said disk, the height of the insert between its two connecting surfaces being smaller than the distance between the two connection surfaces when the insulating material of the support is at rest, and greater than or equal to said distance when the material is completely deformed by compression between its connection surfaces.

5. The functional group according to claim 4 wherein the connection cable is symmetrical and shielded.

6. The functional group according to claim 4 wherein the connection means of the group comprise an axial conductor embedded in an insulating support which is partially coated with a shielding so that the connection means of the group form a connection surface composed of a disk in which a connecting surface of the conductor is centred.

7. The functional group according to claim 6 wherein the input and output connection means of the group are connected to one another by connecting bars provided at each end with a connection device comprising:
   a support of the insulating material delineated by two substantially parallel opposite connection surfaces;
   a conducting connecting insert integrated in the insulating support and opening onto the two connection surfaces at the level of two parallel flat connecting surfaces, the height of the insert between its two connecting surfaces being smaller than the distance between the two connection surfaces when the insulating material of the support is at rest, and greater than or equal to said distance when the material is completely deformed by compression between its connection surfaces.

8. The functional group according to claim 7 further comprising connection auxiliaries comprising a conducting insert coated in an insulating support from which it opens out at the level of two connecting surfaces in the centre of two disks oriented at 90° with respect to one another.

9. The functional group according to claim 8 comprising three connecting bars in a second housing of the enclosure, different from the first housing, and connecting the input and output connection means, and at least one current measuring coil arranged around a connecting bar.

10. The functional group according to claim 1 further comprising current measuring means housed in a second housing of the enclosure, different from the first housing.

11. The functional group according to claim 10 wherein the current measuring means are directly accessible via a second panel of the enclosure orthogonal to the access panel.

12. The functional group according to claim 11 comprising three shielded voltage sensors the terminals of which comprise an axial conductor embedded in an insulating support which is partially coated by a shielding so that the connection surface of the terminal is a disk in which a connecting surface of the conductor is centred and are aligned orthogonally to the plane of the connection means of the group.

13. A functional measuring unit comprising a functional group according to claim 1 and a compartment located under said group and designed for the cables to run therein.

14. A medium-voltage distribution substation comprising a plurality of functional units at least one of which is defined according to claim 13, said units being connected to one another at the level of their connection means of the group by connecting bars provided at each end with a connection device comprising:
   a support including insulating material delineated by two substantially parallel opposite connection surfaces;
   a conducting connecting insert integrated in the insulating support and opening onto the two connection surfaces at the level of two parallel flat connecting surfaces, the height of the insert between its two connecting surfaces being smaller than the distance between the two connection surfaces when the insulating material of the support is at rest, and greater than or equal to said distance when the material is completely deformed by compression between its connection surfaces.

15. A medium-voltage distribution substation comprising a plurality of functional units wherein at least one of the functional unit comprises a functional group according to claim 1 and a compartment located under said group and designed for the cables to run therein, said units being connected to one another at the level of their connection means of the group by connecting bars provided at each end with a connection device comprising:
- a support including insulating material delineated by two substantially parallel opposite connection surfaces;
- a conducting connecting insert integrated in the insulating support and opening onto the two connection surfaces at the level of two parallel flat connecting surfaces, the height of the insert between its two connecting surfaces being smaller than the distance between the two connection surfaces when the insulating material of the support is at rest, and greater than or equal to said distance when the material is completely deformed by compression between its connection surfaces.

16. A medium-voltage distribution substation according to claim 15 wherein the terminals of the voltage measuring means and the connection means of the functional group comprise an axial conductor embedded in an insulating support which is partially coated by a shielding so that the connection surface of the terminal and of the connection means of the group is a disk in which a connecting surface of the conductor is centred.

17. A functional measuring group for a medium-voltage distribution substation comprising a substantially rectangular enclosure, three current input connection means, voltage measuring means, three current output connection means, and three shielded voltage sensors, each of the voltage sensors having a connection terminal which comprises an axial conductor embedded in an insulating material which is partially coated by a shielding so that the connection surface of the terminal is a disk in which a connecting surface of the conductor is centred, wherein:
- the input, respectively output, connection means are aligned in two parallel planes of the enclosure;
- the enclosure comprises a first housing for the voltage sensors, the compartment of the enclosure being directly accessible via an access panel of the enclosure orthogonal to the planes of the connection means;
- the connection terminals of the voltage sensors are aligned in a plane parallel to the access panel and;
- the connection terminals of the voltage measuring means are connected to the connection means of the group with flexible cables which are provided with a connection device comprising a support of the insulating material delineated by two opposite connection surfaces that are substantially parallel and superposable on a disk and a conducting connecting insert integrated in the insulating support and opening onto the two connection surfaces at the level of two parallel flat connecting surfaces that are superposable on the connection surface of said disk, the height of the insert between its two connecting surfaces being smaller than the distance between the two connection surfaces when the insulating material of the support is at rest, and greater than or equal to said distance when the material is completely deformed by compression between its connection surfaces.

18. The functional group according to claim 17 wherein the connection means of the group comprise an axial conductor embedded in an insulating support which is partially coated with a shielding so that the connection means form a connection surface composed of a disk in which a connecting surface of the conductor is centred, the input and output connection means of the group being connected to one another by three connecting bars located in a second housing of the enclosure, different from the first housing, each connecting bar being provided at each end with a connection device comprising:
- a support of the insulating material delineated by two substantially parallel opposite connection surfaces;
- a conducting connecting insert integrated in the insulating support and opening onto the two connection surfaces at the level of two parallel flat connecting surfaces, the height of the insert between its two connecting surfaces being smaller than the distance between the two connection surfaces when the insulating material of the support is at rest, and greater than or equal to said distance when the material is completely deformed by compression between its connection surfaces.

19. The functional group according to claim 18 comprising at least one current measuring coil arranged around a connecting bar and directly accessible via a second panel of the enclosure orthogonal to the access panel.

* * * * *